(12) United States Patent
Todorokihara

(10) Patent No.: US 12,273,123 B2
(45) Date of Patent: *Apr. 8, 2025

(54) TRANSITION-STATE OUTPUT DEVICE, TIME-TO-DIGITAL CONVERTER, AND ANALOG-TO-DIGITAL CONVERTER CIRCUIT

(71) Applicant: SEIKO EPSON CORPORATION, Tokyo (JP)

(72) Inventor: Masayoshi Todorokihara, Suwa (JP)

(73) Assignee: SEIKO EPSON CORPORATION (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/528,968

(22) Filed: Dec. 5, 2023

(65) Prior Publication Data
US 2024/0106453 A1    Mar. 28, 2024

Related U.S. Application Data

(63) Continuation of application No. 17/533,373, filed on Nov. 23, 2021, now Pat. No. 11,888,499.

(30) Foreign Application Priority Data

Nov. 27, 2020 (JP) ................................ 2020-197280

(51) Int. Cl.
*H03M 1/12* (2006.01)
*H03K 3/03* (2006.01)
*H03M 1/50* (2006.01)

(52) U.S. Cl.
CPC .......... *H03M 1/502* (2013.01); *H03K 3/0315* (2013.01); *H03M 1/1255* (2013.01)

(58) Field of Classification Search
CPC .......... H03M 1/12; H03M 1/502; H03M 1/00; H03M 1/1245; H03M 1/125;

(Continued)

(56) References Cited

U.S. PATENT DOCUMENTS 7,205,924 B2 * 4/2007 Vemulapalli .......... H04L 27/361
    341/166
7,627,069 B2 * 12/2009 Dally .................... H04J 3/0685
    375/376

(Continued)

FOREIGN PATENT DOCUMENTS

JP    2020-178152 A    10/2020
JP    2020-178153 A    10/2020

OTHER PUBLICATIONS

Scott Tancock, Ekin Arabul, and Naim Dahnoun; "A Review of New Time-to-Digital Conversion Techniques"; IEEE Transactions on Instrumentation Andmeasurement, vol. 68, No. 10; published in Oct. 2019 (total 12 pages).

*Primary Examiner* — Linh V Nguyen
(74) *Attorney, Agent, or Firm* — Harness, Dickey & Pierce, P.L.C.

(57) ABSTRACT

A transition-state output device includes: a ring oscillator circuit; a state machine changing in state according to a change in state of the ring oscillator circuit; a transition-state acquisition section acquiring and holding state information including a signal output from the ring oscillator circuit and a signal output from the state machine, synchronously with a reference signal; and an internal-state calculation section calculating an internal state corresponding to a number of changes in state of the ring oscillator circuit, based on the state information held by the transition-state acquisition section. A time until the internal state, after transitioning from a first internal state to a second internal state, transitions to the first internal state again is longer than a time interval of updating the state information held by the transition-state acquisition section.

13 Claims, 27 Drawing Sheets

(58) Field of Classification Search
CPC .. H03M 1/1255; H03L 7/0995; H03L 7/0814; H03L 7/093; H03L 7/099; H03L 7/0802; H03L 7/085; H03L 7/091; H03L 7/0996; H03L 7/0998; H03L 7/16; H03L 7/22; G04F 10/005
USPC ................................ 341/118, 155, 120, 166
See application file for complete search history.

(56) References Cited

U.S. PATENT DOCUMENTS

| | | | |
|---|---|---|---|
| 7,791,525 B2 | 9/2010 | Rivoir | |
| 8,327,179 B2 | 12/2012 | Hsieh | |
| 8,553,503 B2 | 10/2013 | Molchanov et al. | |
| 9,092,013 B2 | 7/2015 | Song et al. | |
| 9,270,288 B2* | 2/2016 | Perrott | H03M 3/368 |
| 9,432,009 B2* | 8/2016 | Whatmough | H03K 5/135 |
| 9,673,833 B1* | 6/2017 | Anker | H03M 1/1023 |
| 9,989,928 B2* | 6/2018 | Wu | G04F 10/005 |
| 10,270,460 B1* | 4/2019 | Buffa | H03M 1/60 |
| 10,558,171 B2 | 2/2020 | Kondo et al. | |
| 11,067,954 B1 | 7/2021 | Bhaumik et al. | |
| 11,309,899 B2 | 4/2022 | Huang | |
| 11,888,499 B2* | 1/2024 | Todorokihara | G04F 10/005 |
| 2015/0077279 A1* | 3/2015 | Song | G04F 10/005 341/155 |
| 2018/0076821 A1* | 3/2018 | Loke | H03L 7/0996 |
| 2018/0088535 A1* | 3/2018 | Wang | G04F 10/005 |
| 2019/0289241 A1* | 9/2019 | Saeki | H04N 25/78 |
| 2019/0296762 A1* | 9/2019 | Todorokihara | H03L 7/099 |
| 2020/0310359 A1* | 10/2020 | Yuan | H03K 3/0315 |
| 2020/0328752 A1 | 10/2020 | Todorokihara | |
| 2020/0328755 A1 | 10/2020 | Todorokihara | |
| 2021/0320668 A1* | 10/2021 | Todorokihara | H03M 1/1245 |

\* cited by examiner

FIG. 3

| S0 | g[2] | g[1] | g[0] | dec[3:0] |
|---|---|---|---|---|
| 0 | 0 | 0 | 0 | 0 |
| 1 | 0 | 0 | 0 | 1 |
| 1 | 0 | 0 | 1 | 2 |
| 0 | 0 | 0 | 1 | 3 |
| 0 | 0 | 1 | 1 | 4 |
| 1 | 0 | 1 | 1 | 5 |
| 1 | 0 | 1 | 0 | 6 |
| 0 | 0 | 1 | 0 | 7 |
| 0 | 1 | 1 | 0 | 8 |
| 1 | 1 | 1 | 0 | 9 |
| 1 | 1 | 1 | 1 | 10 |
| 0 | 1 | 1 | 1 | 11 |
| 0 | 1 | 0 | 1 | 12 |
| 1 | 1 | 0 | 1 | 13 |
| 1 | 1 | 0 | 0 | 14 |
| 0 | 1 | 0 | 0 | 15 |

FIG. 4

| S0 | g[2] | g[1] | g[0] | dec[2:0] |
|---|---|---|---|---|
| 0 | 0 | 0 | 0 | 0 |
| 1 | 0 | 0 | 0 | 1 |
| 1 | 0 | 0 | 1 | 1 |
| 0 | 0 | 0 | 1 | 2 |
| 0 | 0 | 1 | 1 | 2 |
| 1 | 0 | 1 | 1 | 3 |
| 1 | 0 | 1 | 0 | 3 |
| 0 | 0 | 1 | 0 | 4 |
| 0 | 1 | 1 | 0 | 4 |
| 1 | 1 | 1 | 0 | 5 |
| 1 | 1 | 1 | 1 | 5 |
| 0 | 1 | 1 | 1 | 6 |
| 0 | 1 | 0 | 1 | 6 |
| 1 | 1 | 0 | 1 | 7 |
| 1 | 1 | 0 | 0 | 7 |
| 0 | 1 | 0 | 0 | 0 |

FIG. 9

| PD | CLK edge No. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| T×1.5 | OUT | 0 | 0 | 4 | 12 | 20 | 29 | 37 | 45 | 54 | 62 | 64 | 64 | 64 | 64 | 64 | 64 |
| | C1 | 0 | 0 | 4 | 8 | 8 | 9 | 8 | 8 | 9 | 8 | 2 | 0 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 8 | 24 | 32 | 45 | 48 | 56 | 72 | 72 | 20 | 0 | 0 | 0 | 0 | 0 |
| | DCNT | 0 | 0 | 0 | 8 | 24 | 32 | 45 | 48 | 56 | 72 | 72 | 20 | 0 | 0 | 0 | 0 |
| | TD | 0 | 0 | 0 | 0 | 8 | 32 | 64 | 109 | 157 | 213 | 285 | 357 | 377 | 377 | 377 | 377 |
| T×1.7 | OUT | 0 | 0 | 2 | 10 | 19 | 27 | 35 | 44 | 52 | 60 | 64 | 64 | 64 | 64 | 64 | 64 |
| | C1 | 0 | 0 | 2 | 8 | 9 | 8 | 8 | 9 | 8 | 8 | 4 | 0 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 4 | 24 | 36 | 40 | 48 | 63 | 64 | 72 | 40 | 0 | 0 | 0 | 0 | 0 |
| | DCNT | 0 | 0 | 0 | 4 | 24 | 36 | 40 | 48 | 63 | 64 | 72 | 40 | 0 | 0 | 0 | 0 |
| | TD | 0 | 0 | 0 | 0 | 4 | 28 | 64 | 104 | 152 | 215 | 279 | 351 | 391 | 391 | 391 | 391 |
| T×2.7 | OUT | 0 | 0 | 0 | 2 | 10 | 19 | 27 | 35 | 44 | 52 | 60 | 64 | 64 | 64 | 64 | 64 |
| | C1 | 0 | 0 | 0 | 2 | 8 | 9 | 8 | 8 | 9 | 8 | 8 | 4 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 0 | 6 | 32 | 45 | 48 | 56 | 72 | 72 | 80 | 44 | 0 | 0 | 0 | 0 |
| | DCNT | 0 | 0 | 0 | 0 | 6 | 32 | 45 | 48 | 56 | 72 | 72 | 80 | 44 | 0 | 0 | 0 |
| | TD | 0 | 0 | 0 | 0 | 0 | 6 | 38 | 83 | 131 | 187 | 259 | 331 | 411 | 455 | 455 | 455 |
| T×3.7 | OUT | 0 | 0 | 0 | 0 | 2 | 10 | 19 | 27 | 35 | 44 | 52 | 60 | 64 | 64 | 64 | 64 |
| | C1 | 0 | 0 | 0 | 0 | 2 | 8 | 9 | 8 | 8 | 9 | 8 | 8 | 4 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 0 | 0 | 8 | 40 | 54 | 56 | 64 | 81 | 80 | 88 | 48 | 0 | 0 | 0 |
| | DCNT | 0 | 0 | 0 | 0 | 0 | 8 | 40 | 54 | 56 | 64 | 81 | 80 | 88 | 48 | 0 | 0 |
| | TD | 0 | 0 | 0 | 0 | 0 | 0 | 8 | 48 | 102 | 158 | 222 | 303 | 383 | 471 | 519 | 519 |

FIG. 10

| PD | T×1.5 | T×1.7 | T×2.7 | T×3.7 |
|---|---|---|---|---|
| TD | 377 | 391 | 455 | 519 |
| ΔTD | ~ | +14 | +64 | +64 |

FIG. 13

| S0 | S1 | S2 | S3 | S4 | S5 | S6 | S7 | dec[2:0] | dec0[2:0] (P0) | dec2[5:0] (8×dec+dec0) |
|---|---|---|---|---|---|---|---|---|---|---|
| 0 | 1 | 1 | 1 | 1 | 1 | 1 | 1 | 0 | 0 | 0 |
| 0 | 0 | 1 | 1 | 1 | 1 | 1 | 1 | 0 | 1 | 1 |
| 0 | 0 | 0 | 1 | 1 | 1 | 1 | 1 | 0 | 2 | 2 |
| 0 | 0 | 0 | 0 | 1 | 1 | 1 | 1 | 0 | 3 | 3 |
| 0 | 0 | 0 | 0 | 0 | 1 | 1 | 1 | 0 | 4 | 4 |
| 0 | 0 | 0 | 0 | 0 | 0 | 1 | 1 | 0 | 5 | 5 |
| 0 | 0 | 0 | 0 | 0 | 0 | 0 | 1 | 0 | 6 | 6 |
| 0 | 0 | 0 | 0 | 0 | 0 | 0 | 0 | 0 | 7 | 7 |
| 1 | 0 | 0 | 0 | 0 | 0 | 0 | 0 | 1 | 0 | 8 |
| 1 | 1 | 0 | 0 | 0 | 0 | 0 | 0 | 1 | 1 | 9 |
| 1 | 1 | 1 | 0 | 0 | 0 | 0 | 0 | 1 | 2 | 10 |
| 1 | 1 | 1 | 1 | 0 | 0 | 0 | 0 | 1 | 3 | 11 |
| 1 | 1 | 1 | 1 | 1 | 0 | 0 | 0 | 1 | 4 | 12 |
| 1 | 1 | 1 | 1 | 1 | 1 | 0 | 0 | 1 | 5 | 13 |
| 1 | 1 | 1 | 1 | 1 | 1 | 1 | 0 | 1 | 6 | 14 |
| 1 | 1 | 1 | 1 | 1 | 1 | 1 | 1 | 1 | 7 | 15 |
| 0 | 1 | 1 | 1 | 1 | 1 | 1 | 1 | 2 | 0 | 16 |
| 0 | 0 | 1 | 1 | 1 | 1 | 1 | 1 | 2 | 1 | 17 |
| 0 | 0 | 0 | 1 | 1 | 1 | 1 | 1 | 2 | 2 | 18 |
| 0 | 0 | 0 | 0 | 1 | 1 | 1 | 1 | 2 | 3 | 19 |
| 0 | 0 | 0 | 0 | 0 | 1 | 1 | 1 | 2 | 4 | 20 |
| 0 | 0 | 0 | 0 | 0 | 0 | 1 | 1 | 2 | 5 | 21 |
| 0 | 0 | 0 | 0 | 0 | 0 | 0 | 1 | 2 | 6 | 22 |
| 0 | 0 | 0 | 0 | 0 | 0 | 0 | 0 | 2 | 7 | 23 |
| 1 | 0 | 0 | 0 | 0 | 0 | 0 | 0 | 3 | 0 | 24 |
| 1 | 1 | 0 | 0 | 0 | 0 | 0 | 0 | 3 | 1 | 25 |
| 1 | 1 | 1 | 0 | 0 | 0 | 0 | 0 | 3 | 2 | 26 |
| 1 | 1 | 1 | 1 | 0 | 0 | 0 | 0 | 3 | 3 | 27 |
| 1 | 1 | 1 | 1 | 1 | 0 | 0 | 0 | 3 | 4 | 28 |
| 1 | 1 | 1 | 1 | 1 | 1 | 0 | 0 | 3 | 5 | 29 |
| 1 | 1 | 1 | 1 | 1 | 1 | 1 | 0 | 3 | 6 | 30 |
| 1 | 1 | 1 | 1 | 1 | 1 | 1 | 1 | 3 | 7 | 31 |

FIG. 14

| S0 | S1 | S2 | S3 | S4 | S5 | S6 | S7 | dec[2:0] | dec0[2:0] (P0) | dec2[5:0] (8×dec+dec0) |
|---|---|---|---|---|---|---|---|---|---|---|
| 0 | 1 | 1 | 1 | 1 | 1 | 1 | 1 | 4 | 0 | 32 |
| 0 | 0 | 1 | 1 | 1 | 1 | 1 | 1 | 4 | 1 | 33 |
| 0 | 0 | 0 | 1 | 1 | 1 | 1 | 1 | 4 | 2 | 34 |
| 0 | 0 | 0 | 0 | 1 | 1 | 1 | 1 | 4 | 3 | 35 |
| 0 | 0 | 0 | 0 | 0 | 1 | 1 | 1 | 4 | 4 | 36 |
| 0 | 0 | 0 | 0 | 0 | 0 | 1 | 1 | 4 | 5 | 37 |
| 0 | 0 | 0 | 0 | 0 | 0 | 0 | 1 | 4 | 6 | 38 |
| 0 | 0 | 0 | 0 | 0 | 0 | 0 | 0 | 4 | 7 | 39 |
| 1 | 0 | 0 | 0 | 0 | 0 | 0 | 0 | 5 | 0 | 40 |
| 1 | 1 | 0 | 0 | 0 | 0 | 0 | 0 | 5 | 1 | 41 |
| 1 | 1 | 1 | 0 | 0 | 0 | 0 | 0 | 5 | 2 | 42 |
| 1 | 1 | 1 | 1 | 0 | 0 | 0 | 0 | 5 | 3 | 43 |
| 1 | 1 | 1 | 1 | 1 | 0 | 0 | 0 | 5 | 4 | 44 |
| 1 | 1 | 1 | 1 | 1 | 1 | 0 | 0 | 5 | 5 | 45 |
| 1 | 1 | 1 | 1 | 1 | 1 | 1 | 0 | 5 | 6 | 46 |
| 1 | 1 | 1 | 1 | 1 | 1 | 1 | 1 | 5 | 7 | 47 |
| 0 | 1 | 1 | 1 | 1 | 1 | 1 | 1 | 6 | 0 | 48 |
| 0 | 0 | 1 | 1 | 1 | 1 | 1 | 1 | 6 | 1 | 49 |
| 0 | 0 | 0 | 1 | 1 | 1 | 1 | 1 | 6 | 2 | 50 |
| 0 | 0 | 0 | 0 | 1 | 1 | 1 | 1 | 6 | 3 | 51 |
| 0 | 0 | 0 | 0 | 0 | 1 | 1 | 1 | 6 | 4 | 52 |
| 0 | 0 | 0 | 0 | 0 | 0 | 1 | 1 | 6 | 5 | 53 |
| 0 | 0 | 0 | 0 | 0 | 0 | 0 | 1 | 6 | 6 | 54 |
| 0 | 0 | 0 | 0 | 0 | 0 | 0 | 0 | 6 | 7 | 55 |
| 1 | 0 | 0 | 0 | 0 | 0 | 0 | 0 | 7 | 0 | 56 |
| 1 | 1 | 0 | 0 | 0 | 0 | 0 | 0 | 7 | 1 | 57 |
| 1 | 1 | 1 | 0 | 0 | 0 | 0 | 0 | 7 | 2 | 58 |
| 1 | 1 | 1 | 1 | 0 | 0 | 0 | 0 | 7 | 3 | 59 |
| 1 | 1 | 1 | 1 | 1 | 0 | 0 | 0 | 7 | 4 | 60 |
| 1 | 1 | 1 | 1 | 1 | 1 | 0 | 0 | 7 | 5 | 61 |
| 1 | 1 | 1 | 1 | 1 | 1 | 1 | 0 | 7 | 6 | 62 |
| 1 | 1 | 1 | 1 | 1 | 1 | 1 | 1 | 7 | 7 | 63 |

FIG. 17

| S0 | S1 | S2 | S3 | S4 | S5 | S6 | S7 | dec[2:0] | P0 | P4 | x4 | dec0[3:0] (P0+P4+x4) | dec2[6:0] (8×dec+dec0) |
|---|---|---|---|---|---|---|---|---|---|---|---|---|---|
| 0 | 1 | 1 | 1 | 1 | 1 | 0 | 0 | 0 | 0 | 1 | 0 | 1 | 1 |
| 0 | 1 | 1 | 1 | 1 | 1 | 1 | 0 | 0 | 0 | 2 | 0 | 2 | 2 |
| 0 | 0 | 1 | 1 | 1 | 1 | 1 | 0 | 0 | 1 | 2 | 0 | 3 | 3 |
| 0 | 0 | 1 | 1 | 1 | 1 | 1 | 1 | 0 | 1 | 3 | 0 | 4 | 4 |
| 0 | 0 | 0 | 1 | 1 | 1 | 1 | 1 | 0 | 2 | 3 | 0 | 5 | 5 |
| 0 | 0 | 0 | 0 | 1 | 1 | 1 | 1 | 0 | 3 | 3 | 0 | 6 | 6 |
| 0 | 0 | 0 | 0 | 0 | 1 | 1 | 1 | 0 | 3 | 0 | 4 | 7 | 7 |
| 0 | 0 | 0 | 0 | 0 | 0 | 1 | 1 | 0 | 3 | 1 | 4 | 8 | 8 |
| 1 | 0 | 0 | 0 | 0 | 0 | 1 | 1 | 1 | 0 | 1 | 0 | 1 | 9 |
| 1 | 0 | 0 | 0 | 0 | 0 | 0 | 1 | 1 | 0 | 2 | 0 | 2 | 10 |
| 1 | 1 | 0 | 0 | 0 | 0 | 0 | 1 | 1 | 1 | 2 | 0 | 3 | 11 |
| 1 | 1 | 0 | 0 | 0 | 0 | 0 | 0 | 1 | 1 | 3 | 0 | 4 | 12 |
| 1 | 1 | 1 | 0 | 0 | 0 | 0 | 0 | 1 | 2 | 3 | 0 | 5 | 13 |
| 1 | 1 | 1 | 1 | 0 | 0 | 0 | 0 | 1 | 3 | 3 | 0 | 6 | 14 |
| 1 | 1 | 1 | 1 | 1 | 0 | 0 | 0 | 1 | 3 | 0 | 4 | 7 | 15 |
| 1 | 1 | 1 | 1 | 1 | 1 | 0 | 0 | 1 | 3 | 1 | 4 | 8 | 16 |
| 0 | 1 | 1 | 1 | 1 | 1 | 0 | 0 | 2 | 0 | 1 | 0 | 1 | 17 |
| 0 | 1 | 1 | 1 | 1 | 1 | 1 | 0 | 2 | 0 | 2 | 0 | 2 | 18 |
| 0 | 0 | 1 | 1 | 1 | 1 | 1 | 0 | 2 | 1 | 2 | 0 | 3 | 19 |
| 0 | 0 | 1 | 1 | 1 | 1 | 1 | 1 | 2 | 1 | 3 | 0 | 4 | 20 |
| 0 | 0 | 0 | 1 | 1 | 1 | 1 | 1 | 2 | 2 | 3 | 0 | 5 | 21 |
| 0 | 0 | 0 | 0 | 1 | 1 | 1 | 1 | 2 | 3 | 3 | 0 | 6 | 22 |
| 0 | 0 | 0 | 0 | 0 | 1 | 1 | 1 | 2 | 3 | 0 | 4 | 7 | 23 |
| 0 | 0 | 0 | 0 | 0 | 0 | 1 | 1 | 2 | 3 | 1 | 4 | 8 | 24 |
| 1 | 0 | 0 | 0 | 0 | 0 | 1 | 1 | 3 | 0 | 1 | 0 | 1 | 25 |
| 1 | 0 | 0 | 0 | 0 | 0 | 0 | 1 | 3 | 0 | 2 | 0 | 2 | 26 |
| 1 | 1 | 0 | 0 | 0 | 0 | 0 | 1 | 3 | 1 | 2 | 0 | 3 | 27 |
| 1 | 1 | 0 | 0 | 0 | 0 | 0 | 0 | 3 | 1 | 3 | 0 | 4 | 28 |
| 1 | 1 | 1 | 0 | 0 | 0 | 0 | 0 | 3 | 2 | 3 | 0 | 5 | 29 |
| 1 | 1 | 1 | 1 | 0 | 0 | 0 | 0 | 3 | 3 | 3 | 0 | 6 | 30 |
| 1 | 1 | 1 | 1 | 1 | 0 | 0 | 0 | 3 | 3 | 0 | 4 | 7 | 31 |
| 1 | 1 | 1 | 1 | 1 | 1 | 0 | 0 | 3 | 3 | 1 | 4 | 8 | 32 |

FIG. 18

| S0 | S1 | S2 | S3 | S4 | S5 | S6 | S7 | dec[2:0] | P0 | P4 | x4 | dec0[3:0]<br>(P0+P4+x4) | dec2[6:0]<br>(8×dec+dec0) |
|---|---|---|---|---|---|---|---|---|---|---|---|---|---|
| 0 | 1 | 1 | 1 | 1 | 1 | 0 | 0 | 4 | 0 | 1 | 0 | 1 | 33 |
| 0 | 1 | 1 | 1 | 1 | 1 | 1 | 0 | 4 | 0 | 2 | 0 | 2 | 34 |
| 0 | 0 | 1 | 1 | 1 | 1 | 1 | 0 | 4 | 1 | 2 | 0 | 3 | 35 |
| 0 | 0 | 1 | 1 | 1 | 1 | 1 | 1 | 4 | 1 | 3 | 0 | 4 | 36 |
| 0 | 0 | 0 | 1 | 1 | 1 | 1 | 1 | 4 | 2 | 3 | 0 | 5 | 37 |
| 0 | 0 | 0 | 0 | 1 | 1 | 1 | 1 | 4 | 3 | 3 | 0 | 6 | 38 |
| 0 | 0 | 0 | 0 | 0 | 1 | 1 | 1 | 4 | 3 | 0 | 4 | 7 | 39 |
| 0 | 0 | 0 | 0 | 0 | 0 | 1 | 1 | 4 | 3 | 1 | 4 | 8 | 40 |
| 1 | 0 | 0 | 0 | 0 | 0 | 1 | 1 | 5 | 0 | 1 | 0 | 1 | 41 |
| 1 | 0 | 0 | 0 | 0 | 0 | 0 | 1 | 5 | 0 | 2 | 0 | 2 | 42 |
| 1 | 1 | 0 | 0 | 0 | 0 | 0 | 1 | 5 | 1 | 2 | 0 | 3 | 43 |
| 1 | 1 | 0 | 0 | 0 | 0 | 0 | 0 | 5 | 1 | 3 | 0 | 4 | 44 |
| 1 | 1 | 1 | 0 | 0 | 0 | 0 | 0 | 5 | 2 | 3 | 0 | 5 | 45 |
| 1 | 1 | 1 | 1 | 0 | 0 | 0 | 0 | 5 | 3 | 3 | 0 | 6 | 46 |
| 1 | 1 | 1 | 1 | 1 | 0 | 0 | 0 | 5 | 3 | 0 | 4 | 7 | 47 |
| 1 | 1 | 1 | 1 | 1 | 1 | 0 | 0 | 5 | 3 | 1 | 4 | 8 | 48 |
| 0 | 1 | 1 | 1 | 1 | 1 | 0 | 0 | 6 | 0 | 1 | 0 | 1 | 49 |
| 0 | 1 | 1 | 1 | 1 | 1 | 1 | 0 | 6 | 0 | 2 | 0 | 2 | 50 |
| 0 | 0 | 1 | 1 | 1 | 1 | 1 | 0 | 6 | 1 | 2 | 0 | 3 | 51 |
| 0 | 0 | 1 | 1 | 1 | 1 | 1 | 1 | 6 | 1 | 3 | 0 | 4 | 52 |
| 0 | 0 | 0 | 1 | 1 | 1 | 1 | 1 | 6 | 2 | 3 | 0 | 5 | 53 |
| 0 | 0 | 0 | 0 | 1 | 1 | 1 | 1 | 6 | 3 | 3 | 0 | 6 | 54 |
| 0 | 0 | 0 | 0 | 0 | 1 | 1 | 1 | 6 | 3 | 0 | 4 | 7 | 55 |
| 0 | 0 | 0 | 0 | 0 | 0 | 1 | 1 | 6 | 3 | 1 | 4 | 8 | 56 |
| 1 | 0 | 0 | 0 | 0 | 0 | 1 | 1 | 7 | 0 | 1 | 0 | 1 | 57 |
| 1 | 0 | 0 | 0 | 0 | 0 | 0 | 1 | 7 | 0 | 2 | 0 | 2 | 58 |
| 1 | 1 | 0 | 0 | 0 | 0 | 0 | 1 | 7 | 1 | 2 | 0 | 3 | 59 |
| 1 | 1 | 0 | 0 | 0 | 0 | 0 | 0 | 7 | 1 | 3 | 0 | 4 | 60 |
| 1 | 1 | 1 | 0 | 0 | 0 | 0 | 0 | 7 | 2 | 3 | 0 | 5 | 61 |
| 1 | 1 | 1 | 1 | 0 | 0 | 0 | 0 | 7 | 3 | 3 | 0 | 6 | 62 |
| 1 | 1 | 1 | 1 | 1 | 0 | 0 | 0 | 7 | 3 | 0 | 4 | 7 | 63 |
| 1 | 1 | 1 | 1 | 1 | 1 | 0 | 0 | 7 | 3 | 1 | 4 | 8 | 64 |

FIG. 20

| S0 | S1 | S2 | S3 | S4 | S5 | S6 | S7 | dec[2:0] | P0 | P4 | x4 | dec0[3:0] (P0+P4+x4) | dec2[6:0] (8×dec+dec0) |
|---|---|---|---|---|---|---|---|---|---|---|---|---|---|
| 0 | 1 | 1 | 1 | 1 | 1 | 1 | 1 | 0 | 0 | 3 | 0 | 3 | 3 |
| 0 | 0 | 1 | 1 | 1 | 1 | 1 | 1 | 0 | 1 | 3 | 0 | 4 | 4 |
| 0 | 0 | 0 | 1 | 1 | 1 | 1 | 1 | 0 | 2 | 3 | 0 | 5 | 5 |
| 0 | 0 | 0 | 0 | 1 | 1 | 1 | 1 | 0 | 3 | 3 | 0 | 6 | 6 |
| 0 | 0 | 0 | 0 | 0 | 1 | 1 | 1 | 0 | 3 | 0 | 4 | 7 | 7 |
| 0 | 0 | 0 | 0 | 0 | 0 | 1 | 1 | 0 | 3 | 1 | 4 | 8 | 8 |
| 0 | 0 | 0 | 0 | 0 | 0 | 0 | 1 | 0 | 3 | 2 | 4 | 9 | 9 |
| 0 | 0 | 0 | 0 | 0 | 0 | 0 | 0 | 0 | 3 | 3 | 4 | 10 | 10 |
| 1 | 0 | 0 | 0 | 0 | 0 | 0 | 0 | 1 | 0 | 3 | 0 | 3 | 11 |
| 1 | 1 | 0 | 0 | 0 | 0 | 0 | 0 | 1 | 1 | 3 | 0 | 4 | 12 |
| 1 | 1 | 1 | 0 | 0 | 0 | 0 | 0 | 1 | 2 | 3 | 0 | 5 | 13 |
| 1 | 1 | 1 | 1 | 0 | 0 | 0 | 0 | 1 | 3 | 3 | 0 | 6 | 14 |
| 1 | 1 | 1 | 1 | 1 | 0 | 0 | 0 | 1 | 3 | 0 | 4 | 7 | 15 |
| 1 | 1 | 1 | 1 | 1 | 1 | 0 | 0 | 1 | 3 | 1 | 4 | 8 | 16 |
| 1 | 1 | 1 | 1 | 1 | 1 | 1 | 0 | 1 | 3 | 2 | 4 | 9 | 17 |
| 1 | 1 | 1 | 1 | 1 | 1 | 1 | 1 | 1 | 3 | 3 | 4 | 10 | 18 |
| 0 | 1 | 1 | 1 | 1 | 1 | 1 | 1 | 2 | 0 | 3 | 0 | 3 | 19 |
| 0 | 0 | 1 | 1 | 1 | 1 | 1 | 1 | 2 | 1 | 3 | 0 | 4 | 20 |
| 0 | 0 | 0 | 1 | 1 | 1 | 1 | 1 | 2 | 2 | 3 | 0 | 5 | 21 |
| 0 | 0 | 0 | 0 | 1 | 1 | 1 | 1 | 2 | 3 | 3 | 0 | 6 | 22 |
| 0 | 0 | 0 | 0 | 0 | 1 | 1 | 1 | 2 | 3 | 0 | 4 | 7 | 23 |
| 0 | 0 | 0 | 0 | 0 | 0 | 1 | 1 | 2 | 3 | 1 | 4 | 8 | 24 |
| 0 | 0 | 0 | 0 | 0 | 0 | 0 | 1 | 2 | 3 | 2 | 4 | 9 | 25 |
| 0 | 0 | 0 | 0 | 0 | 0 | 0 | 0 | 2 | 3 | 3 | 4 | 10 | 26 |
| 1 | 0 | 0 | 0 | 0 | 0 | 0 | 0 | 3 | 0 | 3 | 0 | 3 | 27 |
| 1 | 1 | 0 | 0 | 0 | 0 | 0 | 0 | 3 | 1 | 3 | 0 | 4 | 28 |
| 1 | 1 | 1 | 0 | 0 | 0 | 0 | 0 | 3 | 2 | 3 | 0 | 5 | 29 |
| 1 | 1 | 1 | 1 | 0 | 0 | 0 | 0 | 3 | 3 | 3 | 0 | 6 | 30 |
| 1 | 1 | 1 | 1 | 1 | 0 | 0 | 0 | 3 | 3 | 0 | 4 | 7 | 31 |
| 1 | 1 | 1 | 1 | 1 | 1 | 0 | 0 | 3 | 3 | 1 | 4 | 8 | 32 |
| 1 | 1 | 1 | 1 | 1 | 1 | 1 | 0 | 3 | 3 | 2 | 4 | 9 | 33 |
| 1 | 1 | 1 | 1 | 1 | 1 | 1 | 1 | 3 | 3 | 3 | 4 | 10 | 34 |

FIG. 21

| S0 | S1 | S2 | S3 | S4 | S5 | S6 | S7 | dec[2:0] | P0 | P4 | x4 | dec0[3:0] (P0+P4+x4) | dec2[6:0] (8×dec+dec0) |
|----|----|----|----|----|----|----|----|----------|----|----|----|----------------------|------------------------|
| 0  | 1  | 1  | 1  | 1  | 1  | 1  | 1  | 4        | 0  | 3  | 0  | 3                    | 35                     |
| 0  | 0  | 1  | 1  | 1  | 1  | 1  | 1  | 4        | 1  | 3  | 0  | 4                    | 36                     |
| 0  | 0  | 0  | 1  | 1  | 1  | 1  | 1  | 4        | 2  | 3  | 0  | 5                    | 37                     |
| 0  | 0  | 0  | 0  | 1  | 1  | 1  | 1  | 4        | 3  | 3  | 0  | 6                    | 38                     |
| 0  | 0  | 0  | 0  | 0  | 1  | 1  | 1  | 4        | 3  | 0  | 4  | 7                    | 39                     |
| 0  | 0  | 0  | 0  | 0  | 0  | 1  | 1  | 4        | 3  | 1  | 4  | 8                    | 40                     |
| 0  | 0  | 0  | 0  | 0  | 0  | 0  | 1  | 4        | 3  | 2  | 4  | 9                    | 41                     |
| 0  | 0  | 0  | 0  | 0  | 0  | 0  | 0  | 4        | 3  | 3  | 4  | 10                   | 42                     |
| 1  | 0  | 0  | 0  | 0  | 0  | 0  | 0  | 5        | 0  | 3  | 0  | 3                    | 43                     |
| 1  | 1  | 0  | 0  | 0  | 0  | 0  | 0  | 5        | 1  | 3  | 0  | 4                    | 44                     |
| 1  | 1  | 1  | 0  | 0  | 0  | 0  | 0  | 5        | 2  | 3  | 0  | 5                    | 45                     |
| 1  | 1  | 1  | 1  | 0  | 0  | 0  | 0  | 5        | 3  | 3  | 0  | 6                    | 46                     |
| 1  | 1  | 1  | 1  | 1  | 0  | 0  | 0  | 5        | 3  | 0  | 4  | 7                    | 47                     |
| 1  | 1  | 1  | 1  | 1  | 1  | 0  | 0  | 5        | 3  | 1  | 4  | 8                    | 48                     |
| 1  | 1  | 1  | 1  | 1  | 1  | 1  | 0  | 5        | 3  | 2  | 4  | 9                    | 49                     |
| 1  | 1  | 1  | 1  | 1  | 1  | 1  | 1  | 5        | 3  | 3  | 4  | 10                   | 50                     |
| 0  | 1  | 1  | 1  | 1  | 1  | 1  | 1  | 6        | 0  | 3  | 0  | 3                    | 51                     |
| 0  | 0  | 1  | 1  | 1  | 1  | 1  | 1  | 6        | 1  | 3  | 0  | 4                    | 52                     |
| 0  | 0  | 0  | 1  | 1  | 1  | 1  | 1  | 6        | 2  | 3  | 0  | 5                    | 53                     |
| 0  | 0  | 0  | 0  | 1  | 1  | 1  | 1  | 6        | 3  | 3  | 0  | 6                    | 54                     |
| 0  | 0  | 0  | 0  | 0  | 1  | 1  | 1  | 6        | 3  | 0  | 4  | 7                    | 55                     |
| 0  | 0  | 0  | 0  | 0  | 0  | 1  | 1  | 6        | 3  | 1  | 4  | 8                    | 56                     |
| 0  | 0  | 0  | 0  | 0  | 0  | 0  | 1  | 6        | 3  | 2  | 4  | 9                    | 57                     |
| 0  | 0  | 0  | 0  | 0  | 0  | 0  | 0  | 6        | 3  | 3  | 4  | 10                   | 58                     |
| 1  | 0  | 0  | 0  | 0  | 0  | 0  | 0  | 7        | 0  | 3  | 0  | 3                    | 59                     |
| 1  | 1  | 0  | 0  | 0  | 0  | 0  | 0  | 7        | 1  | 3  | 0  | 4                    | 60                     |
| 1  | 1  | 1  | 0  | 0  | 0  | 0  | 0  | 7        | 2  | 3  | 0  | 5                    | 61                     |
| 1  | 1  | 1  | 1  | 0  | 0  | 0  | 0  | 7        | 3  | 3  | 0  | 6                    | 62                     |
| 1  | 1  | 1  | 1  | 1  | 0  | 0  | 0  | 7        | 3  | 0  | 4  | 7                    | 63                     |
| 1  | 1  | 1  | 1  | 1  | 1  | 0  | 0  | 7        | 3  | 1  | 4  | 8                    | 64                     |
| 1  | 1  | 1  | 1  | 1  | 1  | 1  | 0  | 7        | 3  | 2  | 4  | 9                    | 65                     |
| 1  | 1  | 1  | 1  | 1  | 1  | 1  | 1  | 7        | 3  | 3  | 4  | 10                   | 66                     |

FIG. 26

| PD | CLK edge No. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| T×1.5 | OUT | 0 | 0 | 4 | 12 | 20 | 29 | 37 | 45 | 54 | 62 | 70 | 79 | 87 | 95 | 104 | 112 |
| | C1 | 0 | 0 | 4 | 8 | 8 | 9 | 8 | 8 | 9 | 8 | 8 | 9 | 8 | 8 | 9 | 8 |
| | OUT' | 0 | 0 | 4 | 12 | 20 | 29 | 37 | 45 | 54 | 62 | 64 | 64 | 64 | 64 | 64 | 64 |
| | C2 | 0 | 0 | 4 | 8 | 8 | 9 | 8 | 8 | 9 | 8 | 2 | 0 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 8 | 24 | 32 | 45 | 48 | 56 | 72 | 72 | 20 | 0 | 0 | 0 | 0 | 0 |
| | DCNT | 0 | 0 | 0 | 8 | 24 | 32 | 45 | 48 | 56 | 72 | 72 | 20 | 0 | 0 | 0 | 0 |
| | TD | 0 | 0 | 0 | 0 | 8 | 32 | 64 | 109 | 157 | 213 | 285 | 357 | 377 | 377 | 377 | 377 |
| T×1.7 | OUT | 0 | 0 | 2 | 10 | 19 | 27 | 35 | 44 | 52 | 60 | 69 | 77 | 85 | 94 | 102 | 110 |
| | C1 | 0 | 0 | 2 | 8 | 9 | 8 | 8 | 9 | 8 | 8 | 9 | 8 | 8 | 9 | 8 | 8 |
| | OUT' | 0 | 0 | 2 | 10 | 19 | 27 | 35 | 44 | 52 | 60 | 64 | 64 | 64 | 64 | 64 | 64 |
| | C2 | 0 | 0 | 2 | 8 | 9 | 8 | 8 | 9 | 8 | 8 | 4 | 0 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 4 | 24 | 36 | 40 | 48 | 63 | 64 | 72 | 40 | 0 | 0 | 0 | 0 | 0 |
| | DCNT | 0 | 0 | 0 | 4 | 24 | 36 | 40 | 48 | 63 | 64 | 72 | 40 | 0 | 0 | 0 | 0 |
| | TD | 0 | 0 | 0 | 0 | 4 | 28 | 64 | 104 | 152 | 215 | 279 | 351 | 391 | 391 | 391 | 391 |
| T×2.7 | OUT | 0 | 0 | 0 | 2 | 10 | 19 | 27 | 35 | 44 | 52 | 60 | 69 | 77 | 85 | 94 | 102 |
| | C1 | 0 | 0 | 0 | 2 | 8 | 9 | 8 | 8 | 9 | 8 | 8 | 9 | 8 | 8 | 9 | 8 |
| | OUT' | 0 | 0 | 0 | 2 | 10 | 19 | 27 | 35 | 44 | 52 | 60 | 64 | 64 | 64 | 64 | 64 |
| | C2 | 0 | 0 | 0 | 2 | 8 | 9 | 8 | 8 | 9 | 8 | 8 | 4 | 0 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 0 | 6 | 32 | 45 | 48 | 56 | 72 | 72 | 80 | 44 | 0 | 0 | 0 | 0 |
| | DCNT | 0 | 0 | 0 | 0 | 6 | 32 | 45 | 48 | 56 | 72 | 72 | 80 | 44 | 0 | 0 | 0 |
| | TD | 0 | 0 | 0 | 0 | 0 | 6 | 38 | 83 | 131 | 187 | 259 | 331 | 411 | 455 | 455 | 455 |
| T×3.7 | OUT | 0 | 0 | 0 | 0 | 2 | 10 | 19 | 27 | 35 | 44 | 52 | 60 | 69 | 77 | 85 | 94 |
| | C1 | 0 | 0 | 0 | 0 | 2 | 8 | 9 | 8 | 8 | 9 | 8 | 8 | 9 | 8 | 8 | 9 |
| | OUT' | 0 | 0 | 0 | 0 | 2 | 10 | 19 | 27 | 35 | 44 | 52 | 60 | 64 | 64 | 64 | 64 |
| | C2 | 0 | 0 | 0 | 0 | 2 | 8 | 9 | 8 | 8 | 9 | 8 | 8 | 4 | 0 | 0 | 0 |
| | WC | 0 | 1 | 2 | 3 | 4 | 5 | 6 | 7 | 8 | 9 | 10 | 11 | 12 | 13 | 14 | 15 |
| | CNT | 0 | 0 | 0 | 0 | 8 | 40 | 54 | 56 | 64 | 81 | 80 | 88 | 48 | 0 | 0 | 0 |
| | DCNT | 0 | 0 | 0 | 0 | 0 | 8 | 40 | 54 | 56 | 64 | 81 | 80 | 88 | 48 | 0 | 0 |
| | TD | 0 | 0 | 0 | 0 | 0 | 0 | 8 | 48 | 102 | 158 | 222 | 303 | 383 | 471 | 519 | 519 |

TRANSITION-STATE OUTPUT DEVICE, TIME-TO-DIGITAL CONVERTER, AND ANALOG-TO-DIGITAL CONVERTER CIRCUIT

CROSS-REFERENCE TO RELATED APPLICATIONS

This application is a continuation of U.S. application Ser. No. 17/533,373 filed Nov. 23, 2021, and claims priority from JP Application Serial Number 2020-197280, filed Nov. 27, 2020, the disclosure of which is hereby incorporated by reference herein in its entirety.

BACKGROUND

1. Technical Field

The present disclosure relates to a transition-state output device, a time-to-digital converter, and an analog-to-digital converter circuit.

2. Related Art

JP-A-2020-178153 describes a time-to-digital converter including: a state transition section having a tapped delay line having a plurality of delay elements coupled together, a logic circuit, and a state machine, and starting a state transition based on a trigger signal; a transition-state acquisition section acquiring and holding state information representing an internal state from the state transition section synchronously with a reference signal; and a calculator section calculating a time-digital value corresponding to the number of transitions in the internal state, based on the state information.

In the time-to-digital converter described in JP-A-2020-178153, the duration of each internal state varies relatively largely due to the difference in the delay time and operation speed between components such as the tapped delay line, the logic circuit, and the state machine included in the state transition section. Therefore, in order to improve the linearity of the time-digital value corresponding to the number of transitions in the internal state, correction information acquired by measuring the duration of each internal state is prepared and stored in a storage section in advance and the number of transitions in the internal state is corrected by a numerical calculation using the correction information. Therefore, the time-to-digital converter described in JP-A-2020-178153 needs a correction circuit for improving the linearity and also needs to take the time and effort to prepare correction information that is necessary for the calculation by the correction circuit.

SUMMARY

A transition-state output device according to an aspect of the present disclosure includes: a ring oscillator circuit starting to oscillate based on a trigger signal; a state machine changing in state according to a change in state of the ring oscillator circuit; a transition-state acquisition section acquiring and holding state information including a signal output from the ring oscillator circuit and a signal output from the state machine, synchronously with a reference signal; and an internal-state calculation section calculating an internal state corresponding to a number of changes in state of the ring oscillator circuit, based on the state information held by the transition-state acquisition section. A time until the internal state, after transitioning from a first internal state to a second internal state, transitions to the first internal state again is longer than a time interval of updating the state information held by the transition-state acquisition section.

A time-to-digital converter according to another aspect of the present disclosure includes: the transition-state output device according to the above aspect; and a calculator section calculating a number of transitions in the internal state and calculating a time-digital value corresponding to a time event of the trigger signal, based on the number of transitions.

An analog-to-digital converter circuit according to still another aspect of the present disclosure converts an input analog signal to a digital signal and outputting the digital signal. The analog-to-digital converter circuit includes: the time-to-digital converter according to the above aspect; a reference-waveform-signal generator circuit generating a reference waveform signal based on the reference signal; and a comparator comparing a voltage of the analog signal with a voltage of the reference waveform signal and outputting the trigger signal. The analog-to-digital converter circuit outputs the digital signal based on the time-digital value calculated by the time-to-digital converter.

An analog-to-digital converter circuit according to still another aspect of the present disclosure converts an input analog signal to a digital signal and outputting the digital signal. The analog-to-digital converter circuit includes: the time-to-digital converter according to the above aspect; a sample and hold circuit sampling and holding a voltage of the analog signal; a reference-waveform-signal generator circuit generating a reference waveform signal based on the reference signal; and a comparator comparing the voltage held by the sample and hold circuit with a voltage of the reference waveform signal and outputting the trigger signal. The analog-to-digital converter circuit outputs the digital signal based on the time-digital value calculated by the time-to-digital converter.

BRIEF DESCRIPTION OF THE DRAWINGS

FIG. 3 shows an example of a truth table of a decoder.

FIG. 4 shows another example of the truth table of the decoder.

FIG. 9 shows the relationship between a phase difference PD and a time-digital value TD.

FIG. 10 shows the relationship between the phase difference PD and the time-digital value TD.

FIG. 13 shows an example of a truth table of a decoder.

FIG. 14 shows an example of the truth table of the decoder.

FIG. 17 shows another example of the truth table of the decoder.

FIG. 18 shows another example of the truth table of the decoder.

FIG. 20 shows another example of the truth table of the decoder.

FIG. 21 shows another example of the truth table of the decoder.

FIG. 26 shows the relationship between a phase difference PD and a time-digital value TD.

DESCRIPTION OF EXEMPLARY EMBODIMENTS

Preferred embodiments of the present disclosure will now be described in detail with reference to the drawings. The embodiments described below should not unduly limit the contents of the present disclosure described in the appended claims. Not all the configurations described below are necessarily essential elements of the present disclosure.

1. Time-to-Digital Converter

1-1. First Embodiment 1-1-1. Configuration of Time-to-Digital Converter

Figure 1:
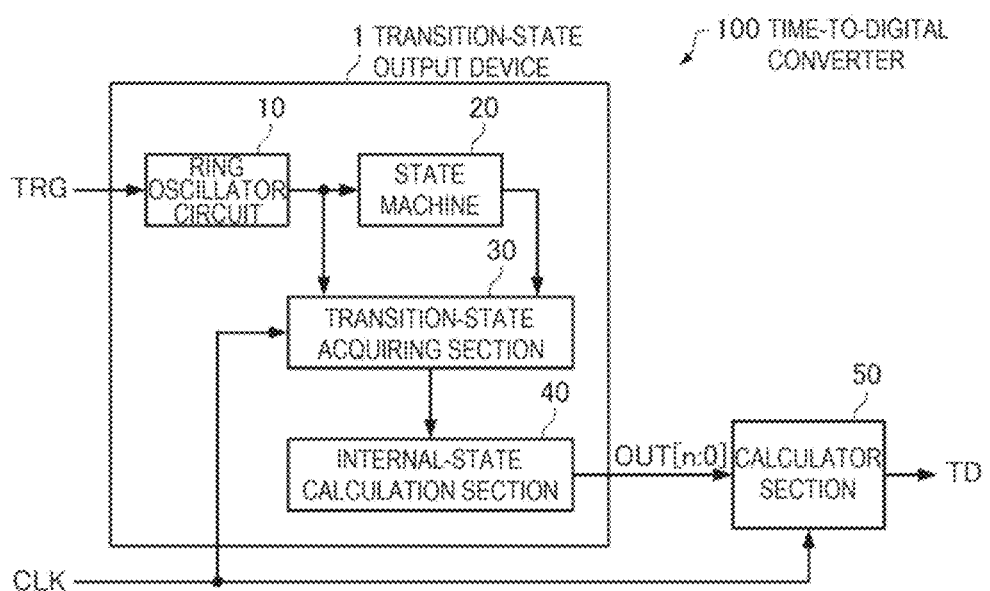
FIG. 1 shows the functional configuration of a time-to-digital converter according to a first embodiment.

FIG. 1 is a functional block diagram showing a time-to-digital converter according to a first embodiment. As shown in FIG. 1, a time-to-digital converter 100 according to the first embodiment has a transition-state output device 1 and a calculator section 50. The transition-state output device 1 has a ring oscillator circuit 10, a state machine 20, a transition-state acquisition section 30, and an internal-state calculation section 40.

The ring oscillator circuit 10 starts to oscillate, based on a trigger signal TRG.

The state machine 20 changes in state according to a change in state of the ring oscillator circuit 10.

The transition-state acquisition section 30 acquires and holds state information including a signal output from the ring oscillator circuit 10 and a signal output from the state machine 20, synchronously with a reference signal CLK.

The internal-state calculation section 40 calculates an internal state corresponding to the number of changes in state of the ring oscillator circuit 10, based on the state information held by the transition-state acquisition section 30.

The transition-state output device 1 outputs a state signal OUT[n:0] of n+1 bits representing the internal state calculated by the internal-state calculation section 40. Here, n is any integer equal to or greater than 0.

The calculator section 50 calculates a number of transitions in the internal state, based on the state signal OUT[n:0], and calculates a time-digital value TD corresponding to a time event of the trigger signal TRG, based on the number of transitions. The calculator section 50 is formed of, for example, an MPU, an FPGA or the like. MPU is an abbreviation of micro-processing unit. FPGA is an abbreviation of field-programmable gate array. In this embodiment, as will be described later, the calculator section 50 weights the number of state transitions, based on the time elapsed, then accumulates the weighted number of state transitions, and thus generates a time-digital value TD corresponding to a phase difference between a time event of the reference signal CLK and a time event of the trigger signal TRG.

The time event of the trigger signal TRG is a timing when the trigger signal TRG changes. For example, this time event may be a rising edge or a falling edge of the trigger signal TRG or may be a rising edge and a falling edge of the trigger signal TRG. Similarly, the time event of the reference signal CLK is a timing when the reference signal CLK changes. For example, this time event may be a rising edge or a falling edge of the reference signal CLK or may be a rising edge and a falling edge of the reference signal CLK.

In the description below, it is assumed that the time event of the trigger signal TRG is a rising edge and a falling edge and that the time event of the reference signal CLK is a rising edge.

1-1-2. Configuration of Transition-State Output Device 1

Figure 2:
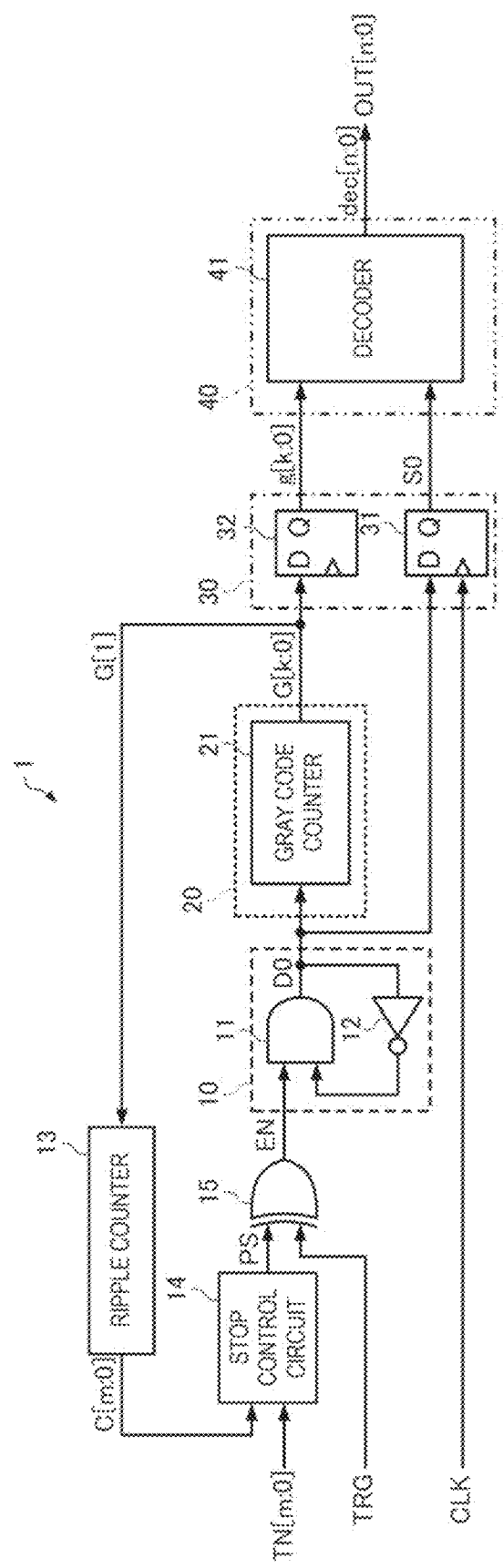
FIG. 2 shows an example of the configuration of a transition-state output device in the first embodiment.

FIG. 2 shows an example of the configuration of the transition-state output device 1. In the example shown in FIG. 2, the transition-state output device 1 has an AND circuit 11, a NOT circuit 12, a ripple counter 13, a stop control circuit 14, an exclusive OR circuit 15, a Gray code counter 21, a D flip-flop 31, a register 32, and a decoder 41.

The AND circuit 11 outputs an AND signal of an enable signal EN output from the exclusive OR circuit 15 and a signal output from the NOT circuit 12. The signal output from the AND circuit 11 is low-level when the enable signal EN is low-level. The signal output from the AND circuit 11 is the same logic level as the signal output from the NOT circuit 12 when the enable signal EN is high-level.

The NOT circuit 12 outputs a signal formed by inverting the logic level of the signal output from the AND circuit 11. Therefore, when the enable signal EN is high-level, the logic level of the signal output from the AND circuit 11 repeats low-level and high-level alternately. That is, the ring oscillator circuit 10 is formed of the AND circuit 11 and the NOT circuit 12 and outputs the signal output from the AND circuit 11, as an oscillating signal D0. A change in the logic level of the oscillating signal D0 can be considered to be equivalent to a change in the state of the ring oscillator circuit 10.

The Gray code counter 21 counts both edges of the oscillating signal D0 output from the ring oscillator circuit 10 and outputs a Gray code signal G[k:0] of k+1 bits corresponding to the count value. The Gray code signal G[k:0] is a signal in which 2 or more bits do not simultaneously change. Depending on the timing, a change in the value of the Gray code signal G[k:0] can be considered to be equivalent to a change in the state of the Gray code counter 21. Therefore, the state machine 20 is formed of the Gray code counter 21. The state machine 20 formed of the Gray code counter 21 changes only by 1 bit of the k+1 bits of the Gray code signal G[k:0] when transitioning from any one state to the next state. That is, the Hamming distance before and after the state transition in the state machine 20 is 1.

The ripple counter 13 counts the number of rising edges of a 1-bit signal G[1] of the Gray code signal G[k:0] output from the Gray code counter 21 and outputs a count signal C[m:0] of m+1 bits. Here, m is any integer equal to or greater than 0. The ripple counter 13 may also count the number of falling edges of the signal G[1] or may count the number of times the logic level of the signal G[1] is inverted. The ripple counter 13 may also count the number of rising edges or falling edges of the oscillating signal D0 or may count the number of times the logic level of the oscillating signal D0 is inverted.

The stop control circuit 14 outputs a stop control signal PS every time the amount of increase in the value of the count signal C[m:0] output from the ripple counter 13 coincides with the value of a stop setting signal TN[m:0] of m+1 bits.

The exclusive OR circuit 15 outputs the enable signal EN, which is an exclusive OR signal of the trigger signal TRG and the stop control signal PS output from the stop control circuit 14. The enable signal EN is high-level when the logic level of the trigger signal TRG and the logic level of the stop control signal PS are different from each other. The enable signal EN is low-level when the logic level of the trigger signal TRG and the logic level of the stop control signal PS are the same.

The D flip-flop 31 acquires the oscillating signal D0 synchronously with a rising edge of the reference signal CLK and holds a signal S0 corresponding to the value of the oscillating signal D0.

The register 32 is a register of k+1 bits formed of k+1 D flip-flops. The register 32 acquires the Gray code signal G[k:0] synchronously with a rising edge of the reference signal CLK and holds a signal g[k:0] corresponding to the value of the Gray code signal G[k:0].

The oscillating signal D0 represents the state of the ring oscillator circuit 10. The Gray code signal G[k:0] represents the state of the Gray code counter 21 forming the state machine 20. Therefore, the transition-state acquisition section 30 is formed of the D flip-flop 31 and the register 32.

The decoder 41 decodes a signal of k+2 bits formed of the signal S0 held by the D flip-flop 31 and the signal g[k:0] held by the register 32 and outputs a decoded signal dec[n:0] of n+1 bits. Here, n is any integer equal to or greater than 1.

The signal S0 represents the state of the ring oscillator circuit 10 at the timing of a rising edge of the reference signal CLK. The signal g[k:0] represents the state of the state machine 20 at the timing of a rising edge of the reference signal CLK. Therefore, the decoded signal dec[n:0] resulting from decoding the signal formed of the signal S0 and the signal g[k:0] can be considered to be equivalent to a signal representing the internal state of the transition-state output device 1 at the timing of a rising edge of the reference signal CLK. That is, the internal-state calculation section 40 is formed of the decoder 41.

The transition-state output device 1 outputs the decoded signal dec[n:0] as the state signal OUT[n:0].

FIG. 3 shows an example of a truth table of the decoder 41. In the example shown in FIGS. 3, k=2 and n=3. In FIG. 3, 0 represents low level and 1 represents high level. The decoded signal dec[3:0] is equivalent to a signal representing the internal state at a rising edge of the reference signal CLK. Therefore, in the example shown in FIG. 3, every time the state of the state machine 20 changes, the value of the internal state increases by 1 from 0 to 15. The value of the internal state returns to 0 after 15. That is, in the example shown in FIG. 3, 16 internal states are defined. Sequential transitions across the 16 internal states take place, either at the timing when the logic level of the oscillating signal D0 changes or at the timing when the value of the decoded signal dec[n:0] changes. The cycle of the oscillating signal D0 is substantially constant and the delay time of the decoder 41 is substantially constant regardless of the value of the decoded signal dec[n:0]. Therefore, the difference in the duration among the 16 internal states is small. However, when the delay time of the decoder 41 is longer than ¼ of the cycle of the oscillating signal D0, the duration of eight internal states where the value of the decoded signal dec[n:0] is an odd number is relatively long and therefore these internal states can be easily acquired by the transition-state acquisition section 30. Meanwhile, the duration of eight internal states where the value of the decoded signal dec[n:0] is an even number is relatively short and therefore these internal states cannot be easily acquired by the transition-state acquisition section 30. Therefore, it is desirable that the delay time of the decoder 41 coincides with ¼ of the cycle of the oscillating signal D0. When this is hard to achieve, the frequency of the internal states acquired by the transition-state acquisition section 30 becomes uneven in the example shown in FIG. 3. However, if the internal state changes synchronously with the timing when the logic level of the oscillating signal D0 is inverted, that is, the timing when the state of the ring oscillator circuit 10 changes, the difference in the duration among the internal states can be minimized regardless of the delay time of the decoder 41.

FIG. 4 shows an example of the truth table of the decoder 41 that defines such internal states. In the example shown in FIGS. 4, k=2 and n=2. In FIG. 4, 0 represents low level and 1 represents high level. In the example shown in FIG. 4, every time the state of the ring oscillator circuit 10 changes, the value of the internal state increases by 1 from 0 to 7. The value of the internal state returns to 0 after 7. That is, in the example shown in FIG. 4, eight internal states are defined. The internal state transitions without exception at the timing when the logic level of the oscillating signal D0 is inverted. Therefore, the duration of the eight internal states coincides with a half cycle of the oscillating signal D0 and the difference thereof is very small. Thus, in the example shown in FIG. 4, while the number of internal states that are defined is smaller than in the example shown in FIG. 3, the frequency of the internal states acquired by the transition-state acquisition section 30 does not become uneven.

Figure 5:
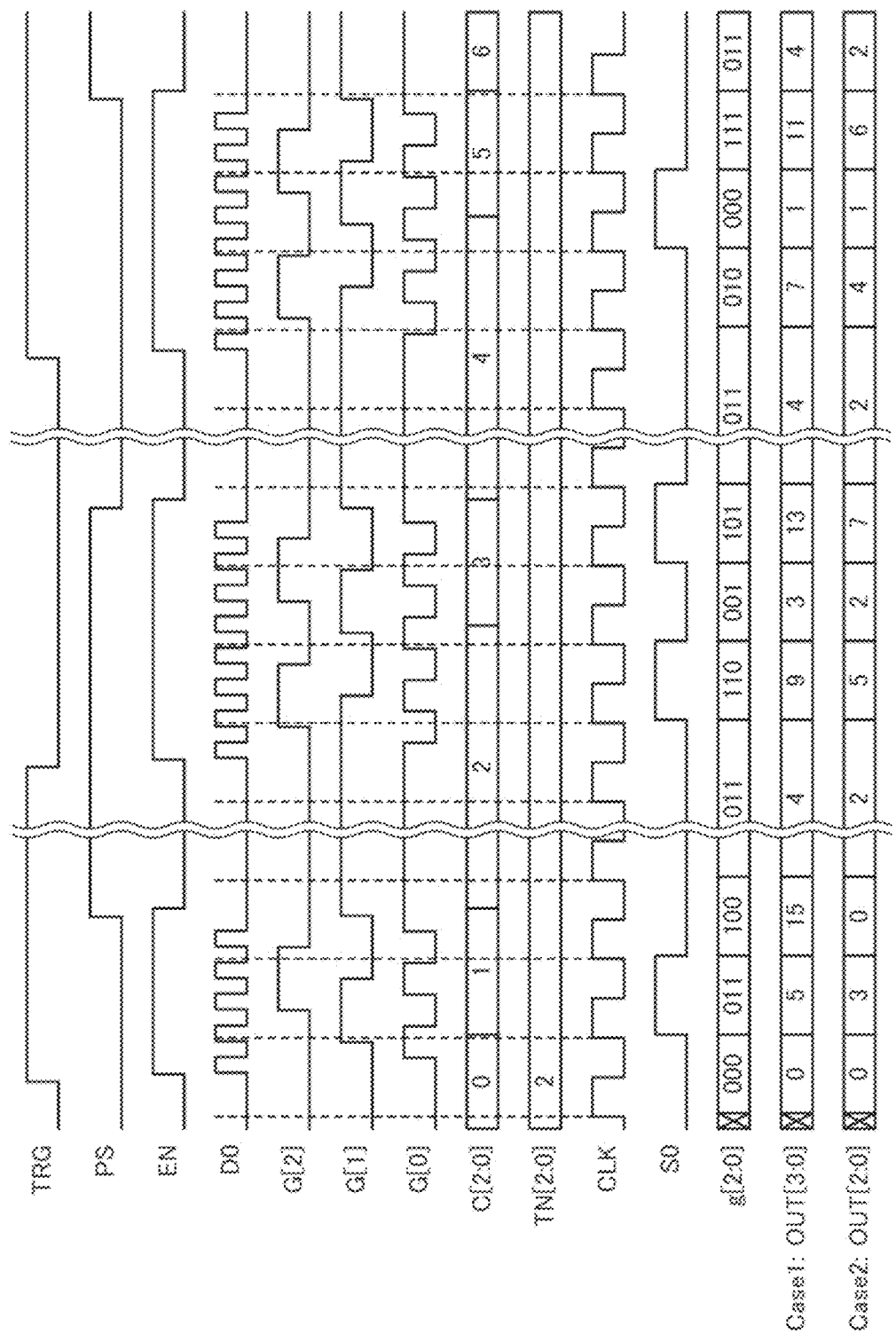
FIG. 5 is a timing chart showing an example of the operation of the transition-state output device.

FIG. 5 is a timing chart showing an example of the operation of the transition-state output device 1. In the example shown in FIG. 5, every time the logic level of the trigger signal TRG is inverted, the enable signal EN transitions from low-level to high-level and the ring oscillator circuit 10 starts to oscillate. Subsequently, every time the amount of increase in the count signal C[m:0] coincides with 2, which is the value of the stop setting signal TN[m:0], the enable signal EN transitions from high-level to low-level and the ring oscillator circuit 10 stops oscillating. Specifically, during the period when the first enable signal EN is high-level, the ring oscillator circuit 10 stops oscillating when the internal states has transitioned 20 times. During the periods when the second and subsequent enable signals EN are high-level, the ring oscillator circuit 10 stops oscillating when the internal state has transitioned 32 times. That is, during the period when the second and subsequent enable signals EN are high-level, the state transition stops when the number of state transitions in the transition-state output device 1 has reached the upper limit value of 32.

When the decoder 41 has the truth table shown in FIG. 3, a state signal OUT[3:0] in Case 1 is output. When the decoder 41 has the truth table shown in FIG. 4, a state signal OUT[2:0] in Case 2 is output. In the example shown in FIG. 5, the cycle of the reference signal CLK is 2.5 times the cycle of the oscillating signal D0. In the example shown in FIG. 3, since the internal state transitions four times during one cycle of the oscillating signal D0, the internal state transitions ten times during one cycle of the reference signal CLK. Therefore, during the period when the enable signal EN is high-level, the value of the state signal OUT[3:0] in Case 1 changes by 10 each at the timing of a rising edge of the reference signal CLK. In the example shown in FIG. 4, since the internal state transitions twice during one cycle of the oscillating signal D0, the internal state transitions five times during one cycle of the reference signal CLK. Therefore, during the period when the enable signal EN is high-level, the value of the state signal OUT[2:0] in Case 2 changes by 5 each at the timing of a rising edge of the reference signal CLK.

In this embodiment, the time until the internal state, after transitioning from an arbitrary first internal state to a second internal state, transitions to the first internal state again is longer than the time interval of updating the state information held by the transition-state acquisition section 30. The time until the internal state transitions to the first internal state again may be paraphrased as the time until the first internal state appears again. For example, in the example shown in FIG. 3, when a state where the oscillating signal D0 is low-level and all the bits of a Gray code signal G[2:0] are low-level is defined as the first internal state, a state where the oscillating signal D0 is high-level and all the bits of the Gray code signal G[2:0] are low-level is the second internal state. In the example shown in FIG. 4, when a case where the oscillating signal D0 is low-level and the bits 1, 0 of the Gray code signal G[2:0] are both low-level is defined as the first internal state, a state where the oscillating signal D0 is high-level and the bits 2, 1 of the Gray code signal G[2:0] are both low-level is the second internal state. The time interval of updating the state information held by the transition-state acquisition section 30 is the time of one cycle of the reference signal CLK. Therefore, in the example shown in FIG. 3, since there are 16 internal states, the time taken for 15 transitions in the internal state is longer than the time of one cycle of the reference signal CLK. In the example shown in FIG. 4, since there are eight internal states, the time taken for seven transitions in the internal state is longer than the time of one cycle of the reference signal CLK.

As the condition that the time until the internal state, after transitioning from an arbitrary first internal state to a second internal state, transitions to the first internal state again is longer than the time interval of updating the state information held by the transition-state acquisition section 30, is satisfied, the calculator section 50 downstream of the transition-state output device 1 can easily find the number of transitions in the internal state during one cycle of the reference signal CLK. However, if this condition is not satisfied, the calculator section 50 needs to identify the number of times the internal state has come full circle, and then find the number of transitions in the internal state during one cycle of the reference signal CLK, using a predetermined calculation formula.

1-1-3. Configuration of Calculator Section

Figure 6:
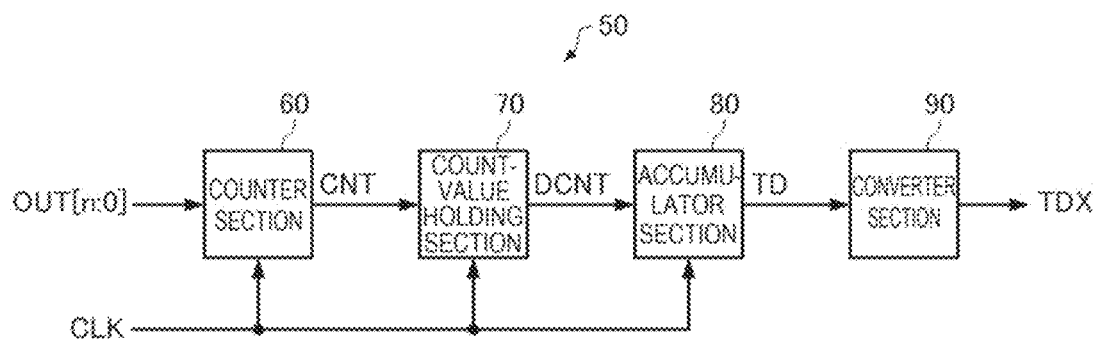
FIG. 6 shows an example of the configuration of a calculator section.

FIG. 6 shows an example of the configuration of the calculator section 50. As shown in FIG. 6, the calculator section 50 has a counter section 60, a count-value holding section 70, an accumulator section 80, and a converter section 90.

The counter section 60 outputs a count value CNT corresponding to the trigger signal TRG, based on the state signal OUT[n:0].

The count-value holding section 70 takes in the count value CNT output from the counter section 60 synchronously with the reference signal CLK and holds the count value CNT as a count value DCNT.

The accumulator section 80 accumulates the count value DCNT held by the count-value holding section 70 synchronously with the reference signal CLK and thus generates the time-digital value TD corresponding to the phase difference between the time event of the reference signal CLK and each time event of the trigger signal TRG. The count-value holding section 70 and the accumulator section 80 are initialized, for example, in response to a reset signal or the like, not illustrated, that is input thereto.

The converter section 90 converts the time-digital value TD output from the accumulator section 80 into a time-digital value TDX. For example, the converter section 90 may convert the time-digital value TD into the time-digital value TDX by performing predetermined scaling on the time-digital value TD or may convert the time-digital value TD into the time-digital value TDX, based on a predetermined conversion formula or table information. However, the calculator section 50 may not include the converter section 90.

The time-digital value TD or the time-digital value TDX calculated by the calculator section 50 is output outside from the time-to-digital converter 100 via a terminal, not illustrated.

Figure 7:
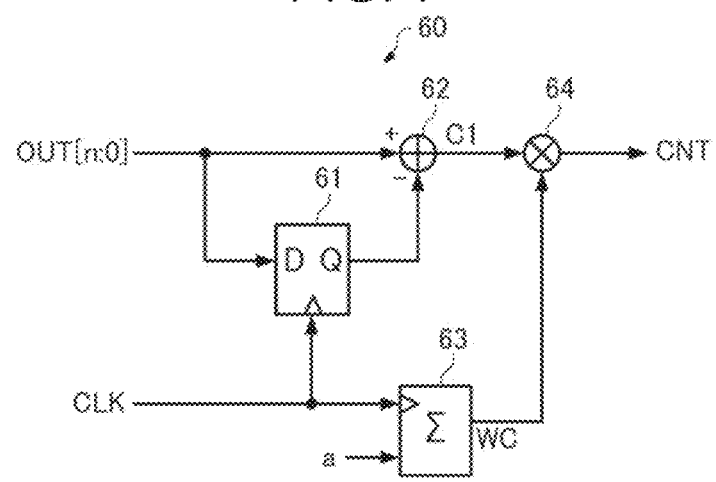
FIG. 7 shows an example of the configuration of a counter section.

FIG. 7 shows an example of the configuration of the counter section 60. The counter section 60 has a register 61, a subtractor 62, an accumulator 63, and a multiplier 64.

The register 61 is formed of n+1 D flip-flops and takes in and holds the state signal OUT[n:0] synchronously with a rising edge of the reference signal CLK.

The subtractor 62 subtracts the value of the signal held by the register 61 from the value of the state signal OUT[n:0]. The value of a signal C1 output from the subtractor 62 is equivalent to the number of times the internal state of the transition-state output device 1 has transitioned during the time of the most recent one cycle of the reference signal CLK.

The accumulator 63 accumulates a constant value a synchronously with a rising edge of the reference signal CLK. Therefore, the accumulator 63 outputs a weight coefficient signal WC having a value that is a times the count value of a rising edge of the reference signal CLK. The value of the weight coefficient signal WC monotonically increases or monotonically decreases with the time elapsed since the occurrence of a rising edge or a falling edge of the trigger signal TRG. Specifically, when the constant value a is a positive number, the value of the weight coefficient signal WC monotonically increases with the time elapsed. When the constant value a is a negative number, the value of the weight coefficient signal WC monotonically decreases with the time elapsed.

The multiplier 64 multiplies the value of the signal C1 by the value of the weight coefficient signal WC and thus calculates the count value CNT. The count value CNT is output from the counter section 60.

Although neither illustrated in FIG. 7 nor described with reference to FIG. 7, a reset signal to initialize the held value to 0 may be input to the register 61 and the accumulator 63 when the state transition in the transition-state output device 1 has stopped or the like.

In this embodiment, the number of times the internal state of the transition-state output device 1 has transitioned during the time of the most recent one cycle of the reference signal CLK is multiplied by the value of the weight coefficient signal WC, thus calculating the count value CNT. However, the number of times the internal state of the transition-state output device 1 has transitioned during a period until the transition-state output device 1 outputs the state signal OUT[n:0] after the trigger signal TRG is input to the time-to-digital converter 100 may be multiplied by the value of the weight coefficient signal WC, thus calculating the count value CNT.

Figure 8:
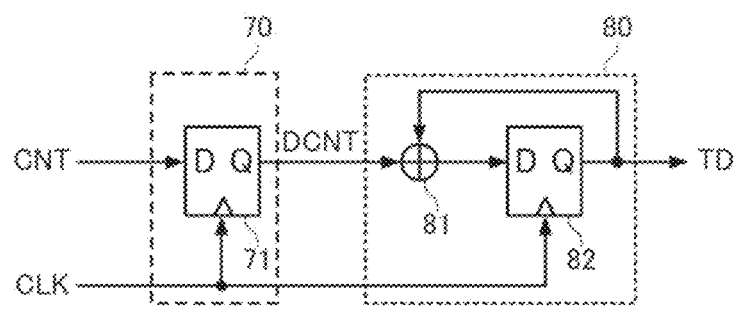
FIG. 8 shows an example of the configuration of a count-value holding section and an accumulator section.

FIG. 8 shows an example of the configuration of the count-value holding section 70 and the accumulator section 80. As shown in FIG. 8, the count-value holding section 70 includes a register 71 formed of a plurality of D flip-flops. The register 71 acquires the count value CNT output from the counter section 60 synchronously with a rising edge of the reference signal CLK and holds the count value CNT as the count value DCNT.

The accumulator section 80 includes an adder 81 and a register 82 formed of a plurality of D flip-flops. The adder 81 adds together the count value DCNT held by the register 71 and a value output from the register 82. The register 82 takes in the value output from the adder 81 synchronously with a rising edge of the reference signal CLK and holds the value as the time-digital value TD.

Although not illustrated in FIG. 8, a reset signal to initialize the held value to 0 may be input to each of the register 71 and the register 82. Thus, the time-digital value TD is initialized to 0, too.

In this embodiment, the time event of the reference signal CLK is set separately from the time event of the trigger signal TRG. That is, the time event of the reference signal CLK and the time event of the trigger signal TRG are asynchronous. The time-digital value TD corresponds to a phase difference PD between the time event of the reference signal CLK and the time event of the trigger signal TRG. For example, the time-digital value TD or the time-digital value TDX is used as a time stamp to the time event of the trigger signal TRG based on the time event of the reference signal CLK.

1-1-4. Relationship Between Phase Difference Between Reference Signal and Trigger Signal, and Time-Digital Value.

FIG. 9 shows the relationship between the phase difference PD between the time event of the reference signal CLK and the time event of the trigger signal TRG, and the time-digital value TD. FIG. 9 also shows the value of the state signal OUT, the value of C1, the value of the weight coefficient signal WC, the count value CNT, and the count value DCNT. In the example shown in FIG. 9, the upper limit value of the number of state transitions in the transition-state output device 1 is 64. The constant value a is 1. T is the time of one cycle of the reference signal CLK.

As shown in FIG. 9, every time a time event of the reference signal CLK occurs, the count value CNT is generated based on the state signal OUT, the signal C1, and the weight coefficient signal WC, and the count value DCNT resulting from holding the count value CNT is accumulated to increases the time-digital value TD. When the time event of the reference signal CLK is the $0^{th}$ rising edge and the phase difference PD is T×1.5, the value of the state signal OUT representing the number of transitions in the internal state of the transition-state output device 1 since the occurrence of the time event of the trigger signal TRG reaches the upper limit value of 64 at the $10^{th}$ rising edge. From the $12^{th}$ rising edge of the reference signal CLK onward, the time-digital value TD is 377.

When the phase difference PD is T×1.7, the value of the state signal OUT reaches the upper limit value of 64 at the $10^{th}$ rising edge of the reference signal CLK. From the $12^{th}$ rising edge of the reference signal CLK onward, the time-digital value TD is 391.

When the phase difference PD is T×2.7, the value of the state signal OUT reaches the upper limit value of 64 at the $11^{th}$ rising edge of the reference signal CLK. From the $13^{th}$ rising edge of the reference signal CLK onward, the time-digital value TD is 455.

When the phase difference PD is T×3.7, the value of the state signal OUT reaches the upper limit value of 64 at the $12^{th}$ rising edge of the reference signal CLK. From the $14^{th}$ rising edge of the reference signal CLK onward, the time-digital value TD is 519.

FIG. 10 shows the relationship between the phase difference PD shown in FIG. 9 and the time-digital value TD after the number of state transitions in the transition-state output device 1 reaches the upper limit value. As shown in FIG. 10, when the phase difference PD is T×1.5, T×1.7, T×2.7, and T×3.7, the time-digital value TD is 377, 391, 455, and 519, respectively, and the difference value ΔTD between the time-digital values TD is +14, +64, and +64, respectively. In the example shown in FIG. 9, since the constant value a is a positive number, the value of the weight coefficient signal WC increases with the lapse of time. As the phase difference PD increases, it takes longer for the number of state transitions in the transition-state output device 1 to reach the upper limit of 64. Therefore, when the phase difference PD increases by the time T of one cycle of the reference signal CLK, the time-digital value TD increases by 64, which is the upper limit value of the number of state transitions.

1-1-5. Advantageous Effects

In the above-described time-to-digital converter 100 according to the first embodiment, the ring oscillator circuit 10 in the transition-state output device 1 has a very simply configuration and therefore the cycle of change in state is substantially constant. The state machine 20 is not included in the oscillation loop of the ring oscillator circuit 10 and changes in state according to the change in state of the ring oscillator circuit 10. Therefore, the cycle of change in state of the state machine 20, too, is substantially constant. That is, the duration of each state of the ring oscillator circuit 10 and the state machine 20 is substantially constant. Thus, in the time-to-digital converter 100 according to the first embodiment, the difference in the duration among the internal states acquired from state information including a signal output from the ring oscillator circuit 10 and a signal output from the state machine 20 can be reduced in the transition-state output device 1. Therefore, the calculator section 50 can calculate the time-digital value TD with high accuracy without performing a calculation to correct the number of transitions in the internal state. Also, since the calculator section 50 need not perform a calculation for correction, the time until the time-digital value TD is calculated after the trigger signal TRG is input is short and the time and effort to prepare correction information that is necessary for the calculation for correction is saved.

In the time-to-digital converter 100 according to the first embodiment, when the internal state is made to change synchronously with a timing when the state of the ring oscillator circuit 10 changes in the transition-state output device 1, the timing when the state of the ring oscillator circuit 10 changes and the timing when the internal state changes are in a relationship of one-to-one correspondence. Thus, in the time-to-digital converter 100 according to the first embodiment, since the cycle of change in state of the ring oscillator circuit 10 is substantially constant, in the transition-state output device 1, the duration of each internal state is substantially constant and the difference in the duration among the internal states can be reduced further.

In the time-to-digital converter 100 according to the first embodiment, the time until the internal state, after transitioning from the first internal state to the second internal state, transitions to the first internal state again is longer than the time interval of updating the state information held by the transition-state acquisition section 30, in the transition-state output device 1. Therefore, the transition-state acquisition section 30 can acquire the state information before the state transition comes full circle. Thus, in the time-to-digital converter 100 according to the first embodiment, the calculator section 50 need not identify the number of times the internal state comes full circle during a period from the acquisition of state information by the transition-state acquisition section 30 to the acquisition of the next state information by the transition-state acquisition section 30. Therefore, the processing by the calculator section 50 can be simplified.

In the time-to-digital converter 100 according to the first embodiment, since the Hamming distance of the state information before and after a transition in the internal state is 1, the transition-state acquisition section 30 can acquire the state information corresponding to one of the two states before and after the state transition in the transition-state output device 1. Therefore, in the time-to-digital converter 100 according to the first embodiment, the risk of acquiring wrong state information can be reduced in the transition-state output device 1 and the calculator section 50 can calculate the time-digital value TD with high accuracy.

In the time-to-digital converter 100 according to the first embodiment, every time the time event of the trigger signal TRG occurs, the counter section 60, the count-value holding section 70, and the accumulator section 80 in the calculator section 50 can operate without being reset and without having a dead period. Therefore, a high noise shaping effect by delta-sigma modulation is achieved. Thus, in the time-to-digital converter 100 according to the first embodiment, since a noise component generated due to a small difference in the duration among the internal states or the like shifts toward high frequencies due to the noise shaping effect in the transition-state output device 1, the calculator section 50 can calculate the time-digital value TD with a high S/N ratio.

1-2. Second Embodiment

A time-to-digital converter according to a second embodiment will now be described mainly in terms of the difference from the first embodiment. Components similar to those in the first embodiment are denoted by the same reference signs. Descriptions similar to those in the first embodiment are omitted or simplified.

Figure 11:
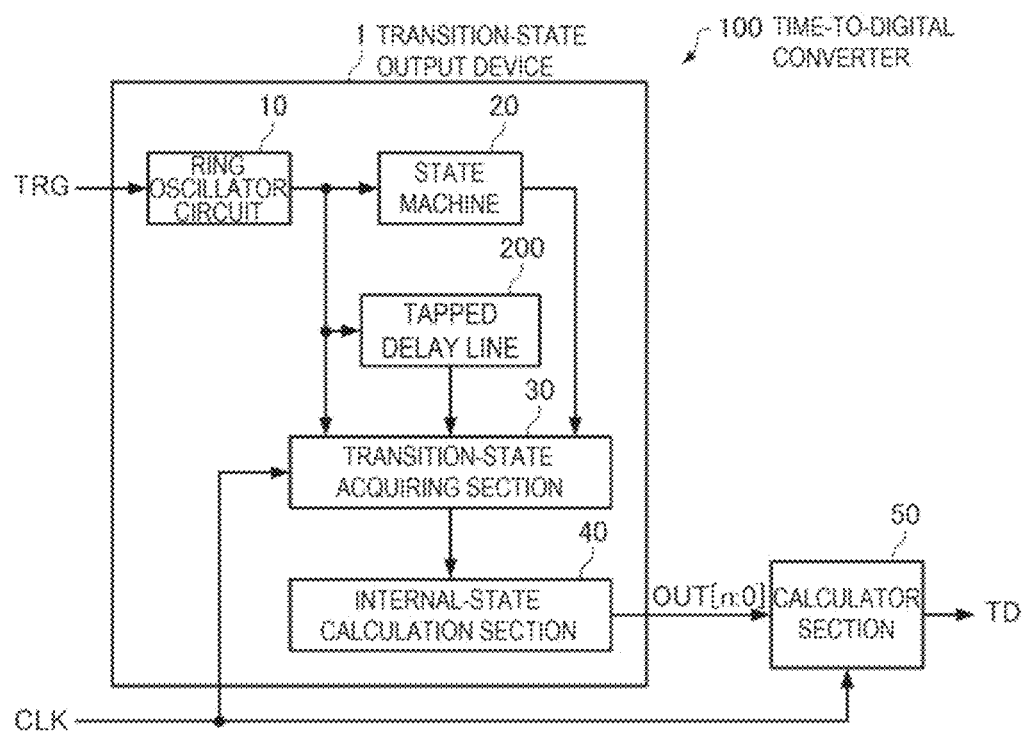
FIG. 11 is a functional block diagram showing a time-to-digital converter according to a second embodiment.

FIG. 11 is a functional block diagram showing a time-to-digital converter 100 according to the second embodiment. As shown in FIG. 11, the time-to-digital converter 100 according to the second embodiment has a transition-state output device 1 and a calculator section 50 and generates a time-digital value TD corresponding to a phase difference between a time event of a reference signal CLK and a time event of a trigger signal TRG, as in the first embodiment.

The transition-state output device 1 has a ring oscillator circuit 10, a state machine 20, a transition-state acquisition section 30, an internal-state calculation section 40, and a tapped delay line 200. The functions of the ring oscillator circuit 10 and the state machine 20 are similar to those in the first embodiment and the description thereof is omitted.

As in the first embodiment, the ring oscillator circuit 10 starts to oscillate, based on the trigger signal TRG. The state machine 20 changes in state according to a change in state of the ring oscillator circuit 10.

The tapped delay line 200 is formed of a plurality of delay elements coupled together. A signal output from the ring oscillator circuit 10 is input to the tapped delay line 200. The signal input to the tapped delay line 200 propagates through the plurality of delay elements.

The transition-state acquisition section 30 acquires and holds state information including a signal output from the ring oscillator circuit 10, a signal output from the state machine 20, and a signal output from the tapped delay line 200, synchronously with the reference signal CLK.

As in the first embodiment, the internal-state calculation section 40 calculates an internal state corresponding to the number of changes in state of the ring oscillator circuit 10, based on the state information held by the transition-state acquisition section 30. The transition-state output device 1 outputs a state signal OUT[n:0] of n+1 bits representing the internal state calculated by the internal-state calculation section 40. Here, n is any integer equal to or greater than 0.

As in the first embodiment, the calculator section 50 calculates a number of transitions in the internal state, based on the state signal OUT[n:0], and calculates a time-digital value TD corresponding to a time event of the trigger signal TRG, based on the number of transitions. The configuration of the calculator section 50 is similar to that in the first embodiment and therefore the illustration and description thereof are omitted.

Figure 12:
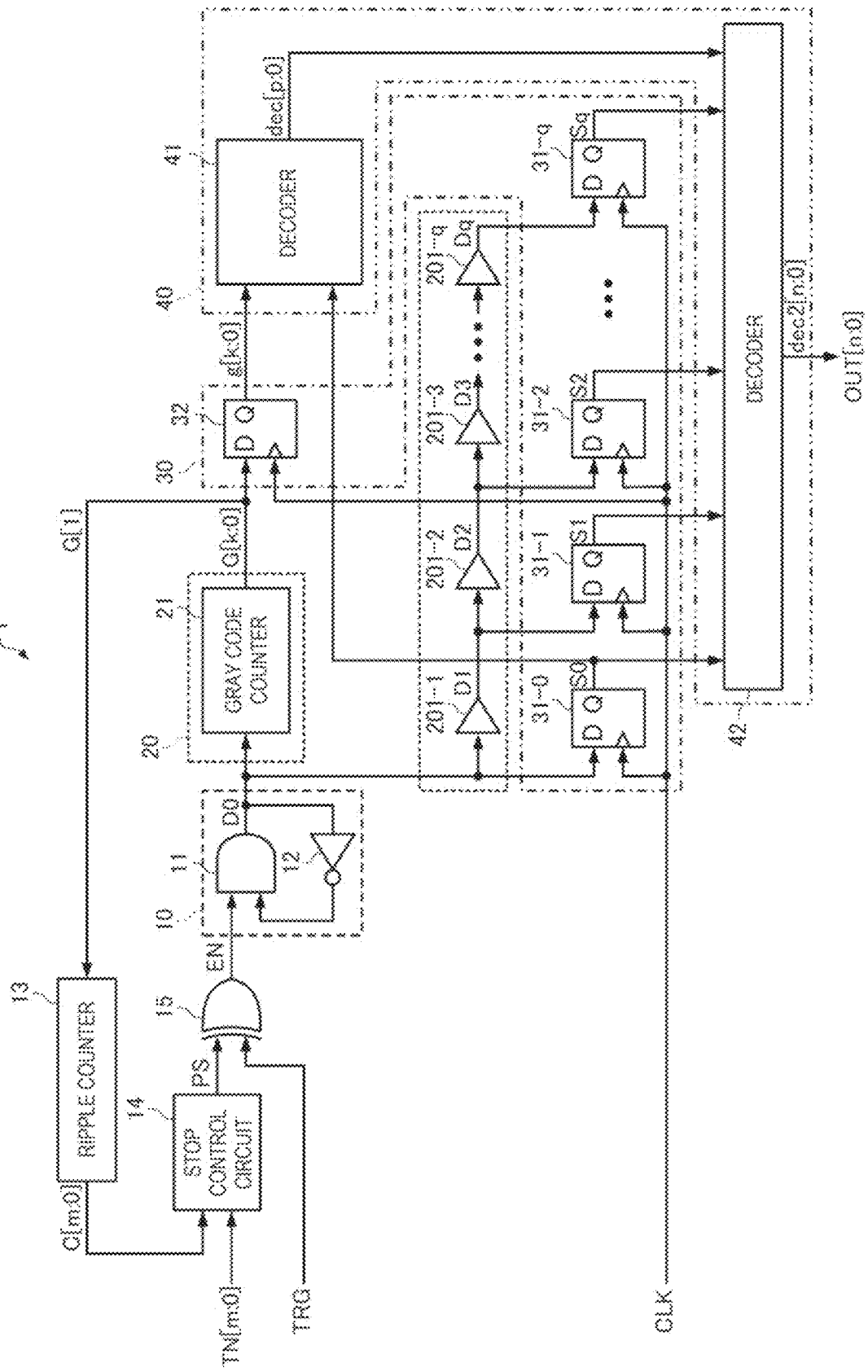
FIG. 12 shows an example of the configuration of a transition-state output device in the second embodiment.

FIG. 12 shows an example of the configuration of the transition-state output device 1 provided in the time-to-digital converter 100 according to the second embodiment. In the example shown in FIG. 12, the transition-state output device 1 has an AND circuit 11, a NOT circuit 12, a ripple counter 13, a stop control circuit 14, an exclusive OR circuit 15, a Gray code counter 21, q+1 D flip-flops 31-0 to 31-$q$, a register 32, a decoder 41, a decoder 42, and q delay elements 201-1 to 201-$q$. Here, q is an integer equal to or greater than 2.

The functions of the AND circuit 11, the NOT circuit 12, the ripple counter 13, the stop control circuit 14, the exclusive OR circuit 15, the Gray code counter 21, the register 32, and the decoder 41 are similar to those in the first embodiment and therefore the description thereof is omitted.

The q delay elements 201-1 to 201-$q$ are coupled together in a chain and thus form the tapped delay line 200. The tapped delay line 200 has one input terminal and q output terminals. Such a tapped delay line 200 is also referred to as a delay line with taps. Each of the delay elements 201-1 to 201-$q$ is a buffer element or an inverter. It is desirable that the delay times of the delay elements 201-1 to 201-$q$ are substantially equal. Therefore, elements of the same type are used as the delay elements 201-1 to 201-$q$. In the description below, it is assumed that all of the delay elements 201-1 to 201-$q$ are buffer elements.

The input terminal of the first delay element 201-1 of the tapped delay line 200 is the input terminal of the tapped delay line 200. The output terminals of the delay elements 201-1 to 201-$q$ are the q output terminals of the tapped delay line 200. Signals D1 to Dq are output from the q output terminals of the tapped delay line 200 in order from the input terminal side of the tapped delay line 200.

An oscillating signal D0 is input to the input terminal of the tapped delay line 200. As the oscillating signal D0 changes from low-level to high-level and the high-level signal D0 propagates through the delay element 201-1, the signal D1 changes from low-level to high-level. Then, as a high-level signal Di-1 propagates through a delay element 201-$i$, a signal Di changes from low-level to high-level, i being an integer equal to or greater than 1 and equal to or smaller than q. That is, a high-level signal propagates sequentially through the delay elements 201-1 to 201-$q$ and the signals D1 to Dq sequentially change from low-level to high-level.

Similarly, as the oscillating signal D0 changes from high-level to low-level and the low-level signal D0 propagates through the delay element 201-1, the signal D1 changes from high-level to low-level. Then, as a low-level signal Di-1 propagates through a delay element 201-$i$, a signal Di changes from high-level to low-level, i being an integer equal to or greater than 1 and equal to or smaller than q. That is, a low-level signal propagates sequentially through the delay elements 201-1 to 201-$q$ and the signals D1 to Dq sequentially change from high-level to low-level.

The D flip-flop 31-0 acquires the oscillating signal D0 synchronously with a rising edge of the reference signal CLK and holds a signal S0 corresponding to the value of the oscillating signal D0. A D flip-flop 31-$i$ acquires the signal Di output from the delay element 201-$i$ synchronously with a rising edge of the reference signal CLK and holds a signal Si corresponding to the value of the oscillating signal Di, i being an integer equal to or greater than 1 and equal to or smaller than q. The oscillating signal D0 represents the state of the ring oscillator circuit 10. The q signals D1 to Dq represent the state of the tapped delay line 200. The Gray code signal G[k:0] represents the state of the Gray code counter 21 forming the state machine 20. Therefore, the D flip-flops 31-0 to 31-$q$ and the register 32 form the transition-state acquisition section 30.

The decoder 42 decodes a signal of p+q+2 bits formed of the signals S0 to Sq held by the q+1 D flip-flops 31-0 to 31-$q$, respectively, and a decoded signal dec[p:0] of p+1 bits output from the decoder 41, and outputs a decoded signal dec2[n:0] of n+1 bits. Here, p and n are any integers equal to or greater than 1.

The signal S0 represents the state of the ring oscillator circuit 10 at the timing of a rising edge of the reference signal CLK. The signal g[k:0] represents the state of the state machine 20 at the timing of a rising edge of the reference signal CLK. Therefore, the decoded signal dec2[n:0] resulting from decoding the signal formed of the signal S0 and the decoded signal dec[p:0] is equivalent to a signal representing the internal state of the transition-state output device 1 at the timing of a rising edge of the reference signal CLK. That is, the internal-state calculation section 40 is formed of the decoder 41 and the decoder 42.

The transition-state output device 1 outputs the decoded signal dec2[n:0] as the state signal OUT[n:0].

FIGS. 13 and 14 show an example of a truth table of the decoder 42. In the example shown in FIGS. 13 and 14, p=2, q=7, and n=5. FIG. 13 shows a truth table where the value of the decoded signal dec2[5:0] is 0 to 31. FIG. 14 shows a truth table where the value of the decoded signal dec2[5:0] is 32 to 63. In FIGS. 13 and 14, 0 represents low level and 1 represents high level. It is assumed that the value of the decoded signal dec[2:0] is acquired according to the truth table shown in FIG. 4. P0 is a function that gives the number of signals having a logic level coincident with that of the signal S0, of the signals S1 to S7. It is assumed that the value of the decoded signal dec0[2:0] is found, based on the function P0.

In the example shown in FIGS. 13 and 14, the value of the decoded signal dec2[5:0] is a value that is eight times the value of the decoded signal dec[2:0] plus the value of the decoded signal dec0[2:0]. The decoded signal dec2[5:0] is equivalent to a signal representing the internal state at a rising edge of the reference signal CLK. Every time the state of the ring oscillator circuit 10 or the state of the tapped delay line 200 changes, the value of the internal state increases by 1 from 0 to 63. The value of the internal state returns to 0 after 63. That is, in the example shown in FIGS. 13 and 14, 64 internal states are defined, that is, eight times the number of internal states in the example shown in FIG. 4.

In the example shown in FIGS. 13 and 14, sequential transitions across the 64 internal states take place, either at the timing when the logic level of the oscillating signal D0 changes or at the timing when the logic level of signals D1 to D7 output from the tapped delay line 200 changes. The cycle of the oscillating signal D0 is substantially constant and the delay times of the q delay elements 201-1 to 201-$q$ are substantially constant. Therefore, the difference in the duration among the 64 internal states is small. However, when the time until the ring oscillator circuit 10 transitions to the next state after the state transition where the logic level of the delay element 201-$q$ at the final stage of the tapped delay line 200 changes is long, the duration of eight internal states with the decoded signal dec2[n:0] having values of 7, 15, 23, 31, 39, 47, 55, and 63 is longer than the duration of the other 56 internal states. Therefore, the frequency of the internal states acquired by the transition-state acquisition section 30 becomes uneven. Thus, it is preferable that the time until the ring oscillator circuit 10 transitions to the next state after the state transition of the delay element 201-$q$ at the final stage of the tapped delay line 200 is equal to or less than the average value of the delay times of the plurality of delay elements 201-1 to 201-$q$ included in the tapped delay line 200. When the delay times of the delay elements 201-1 to 201-$q$ are equal, the average value is equal to the delay time of each of the delay elements 201-1 to 201-$q$. Particularly when this time coincides with the average value of the delay times of the plurality of delay elements 201-1 to 201-$q$, the measured times of the 64 internal states are substantially equal and the frequency of the internal states acquired by the transition-state acquisition section 30 scarcely becomes uneven.

The truth tables shown in FIGS. 13 and 14 hold on condition that the delay time of the tapped delay line 200 is shorter than the half cycle of the oscillating signal D0. The delay time of the tapped delay line 200 is the time until the logic level of a signal Dq output from the delay element 201-$q$ at the final stage changes due to a change in the logic level of the oscillating signal D0, after the logic level of the oscillating signal D0 changes.

Figure 15:
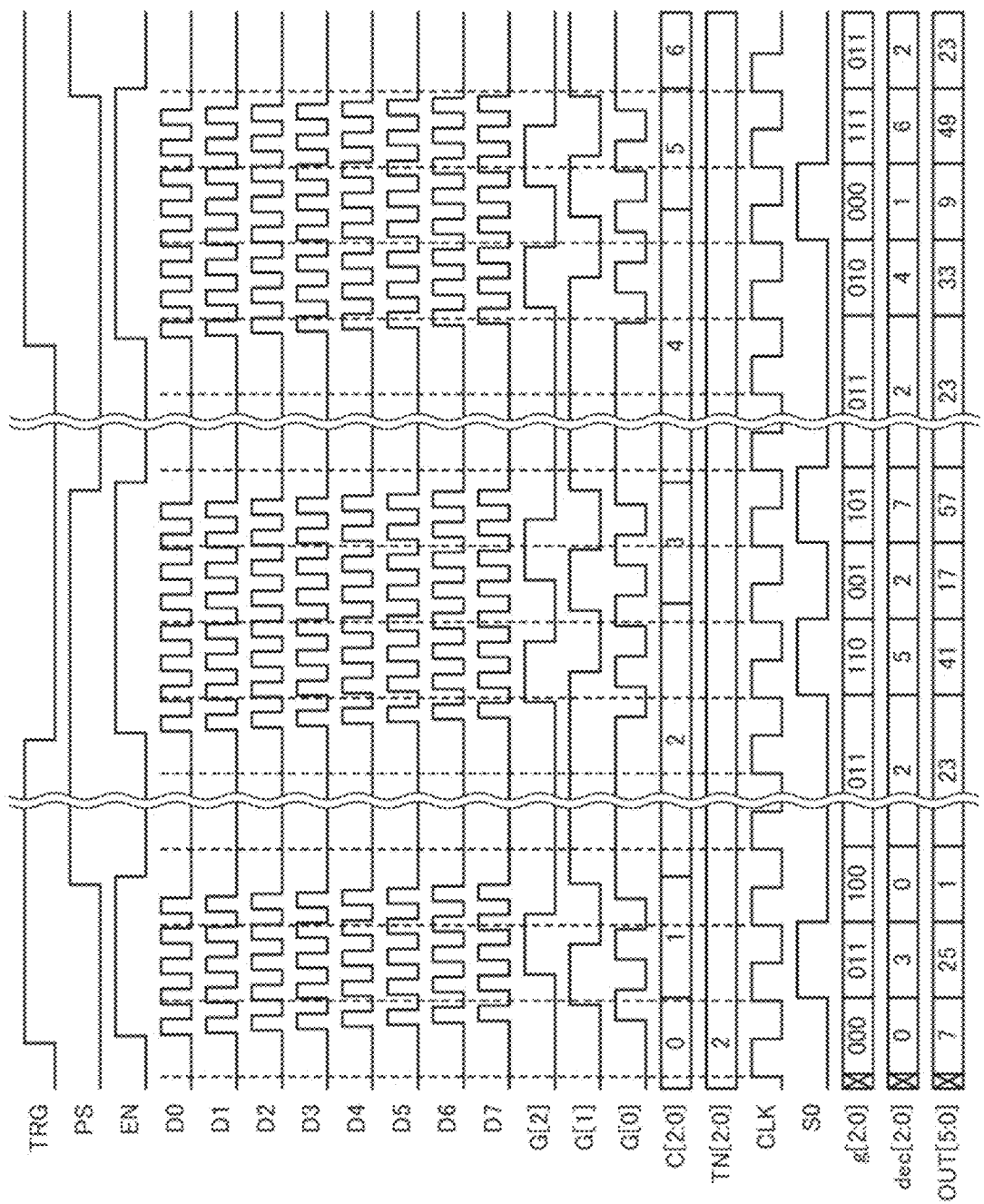
FIG. 15 is a timing chart showing an example of the operation of the transition-state output device.
Figure 16:
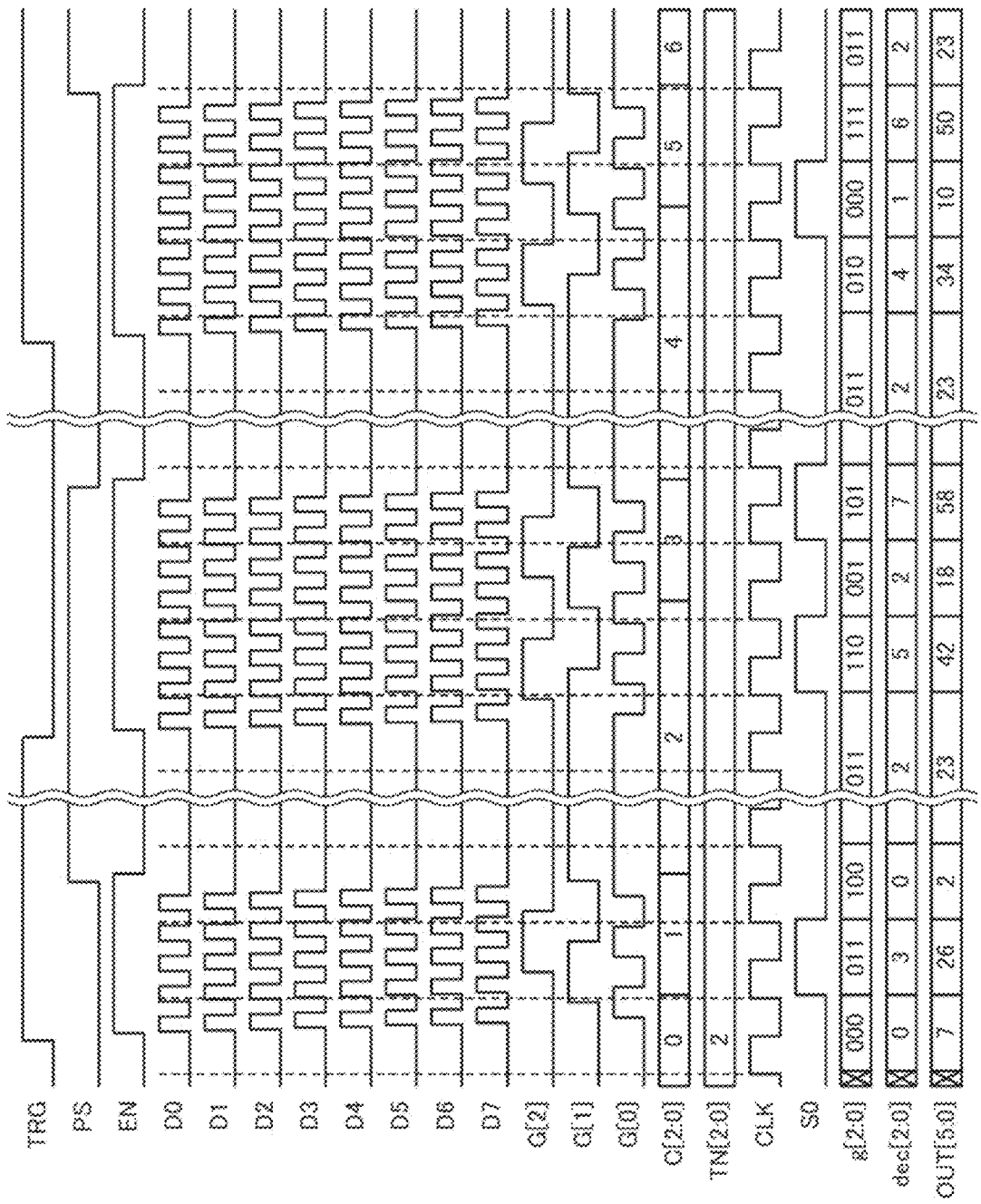
FIG. 16 is a timing chart showing an example of the operation of the transition-state output device.

FIGS. 15 and 16 are timing charts showing an example of the operation of the transition-state output device 1 when the truth tables shown in FIGS. 13 and 14 hold. The example shown in FIG. 15 is an ideal case where the time until the ring oscillator circuit 10 transitions to the next state coincides with the average value of the delay times of the delay elements 201-1 to 201-$q$. The example shown in FIG. 16 is a case where the time until the ring oscillator circuit 10 transitions to the next state is longer than the average value of the delay times of the delay elements 201-1 to 201-$q$. In the examples shown in FIGS. 15 and 16, the cycle of the reference signal CLK is 2.5 times the cycle of the oscillating signal D0. Since the internal state transitions 16 times during one cycle of the oscillating signal D0, the internal state transitions 40 times during one cycle of the reference signal CLK. Therefore, in the example shown in FIG. 15 and the example shown in FIG. 16, the value of the state signal OUT[5:0] changes by 40 each at the timing of a rising edge of the reference signal CLK during the period when the enable signal EN is high-level, though the value of the state signal OUT[5:0] differs between these examples.

In this way, in FIGS. 15 and 16, the amount of change in the value of the state signal OUT[5:0] is 40, which is eight times the amount of change in the example shown in FIG. 5. Therefore, the resolution of the time-digital value TD generated by the calculator section 50 is improved to eight times. To generalize this example, since the tapped delay line 200 includes the q delay elements 201-1 to 201-$q$, the resolution of the time-digital value TD is q+1 times the resolution in the case where the tapped delay line 200 is not provided.

When the condition that the delay time of the tapped delay line 200 is shorter than the half cycle of the oscillating signal D0 is not satisfied, that is, when the delay time of the tapped delay line 200 is equal to or longer than the half cycle of the oscillating signal D0, the logic level of the oscillating signal D0 changes again before the logic level of the signal Dq output from the delay element 201-$q$ at the final stage changes due to a change in the logic level of the oscillating signal D0.

FIGS. 17 and 18 show an example of a truth table of the decoder 42 that defines such internal states. In the example shown in FIGS. 17 and 18, p=2, q=7, and n=6. FIG. 17 shows a truth table where the value of the decoded signal dec2[6:0] is 1 to 32. FIG. 18 shows a truth table where the value of the decoded signal dec2[6:0] is 33 to 64. In FIGS. 17 and 18, 0 represents low level and 1 represents high level. It is assumed that the value of the decoded signal dec[2:0] is acquired according to the truth table shown in FIG. 4. P0 is a function that gives the number of signals having a logic level coincident with that of the signal S0, of the signals S1 to S3. P4 is a function that gives the number of signals having a logic level coincident with that of the signal S4, of the signals S5 to S7. x4 is a function that gives 4 when the logic levels of the signal S0 and the signal S4 coincide with each other and that gives 0 when the logic levels do not coincide with each other. It is assumed that the value of the decoded signal dec0[3:0] is found by the sum of the function P0, the function P4, and the function x4.

In the example shown in FIGS. 17 and 18, the value of the decoded signal dec2[6:0] is a value that is eight times the value of the decoded signal dec[2:0] plus the value of the decoded signal dec0[3:0]. The decoded signal dec2[6:0] is equivalent to a signal representing the internal state at a rising edge of the reference signal CLK. Every time the state of the ring oscillator circuit 10 or the state of the tapped delay line 200 changes, the value of the internal state increases by 1 from 1 to 64. The value of the internal state returns to 1 after 64. That is, in the example shown in FIGS. 17 and 18, 64 internal states are defined, as in the example shown in FIGS. 13 and 14.

The truth tables shown in FIGS. 17 and 18 hold on condition that the logic level of the oscillating signal D0 changes again during the period until the logic level of the signal D6 output from the delay element 201-6 changes after the logic level of the signal D5 output from the delay element 201-5 changes due to a change in the logic level of the oscillating signal D0.

Figure 19:
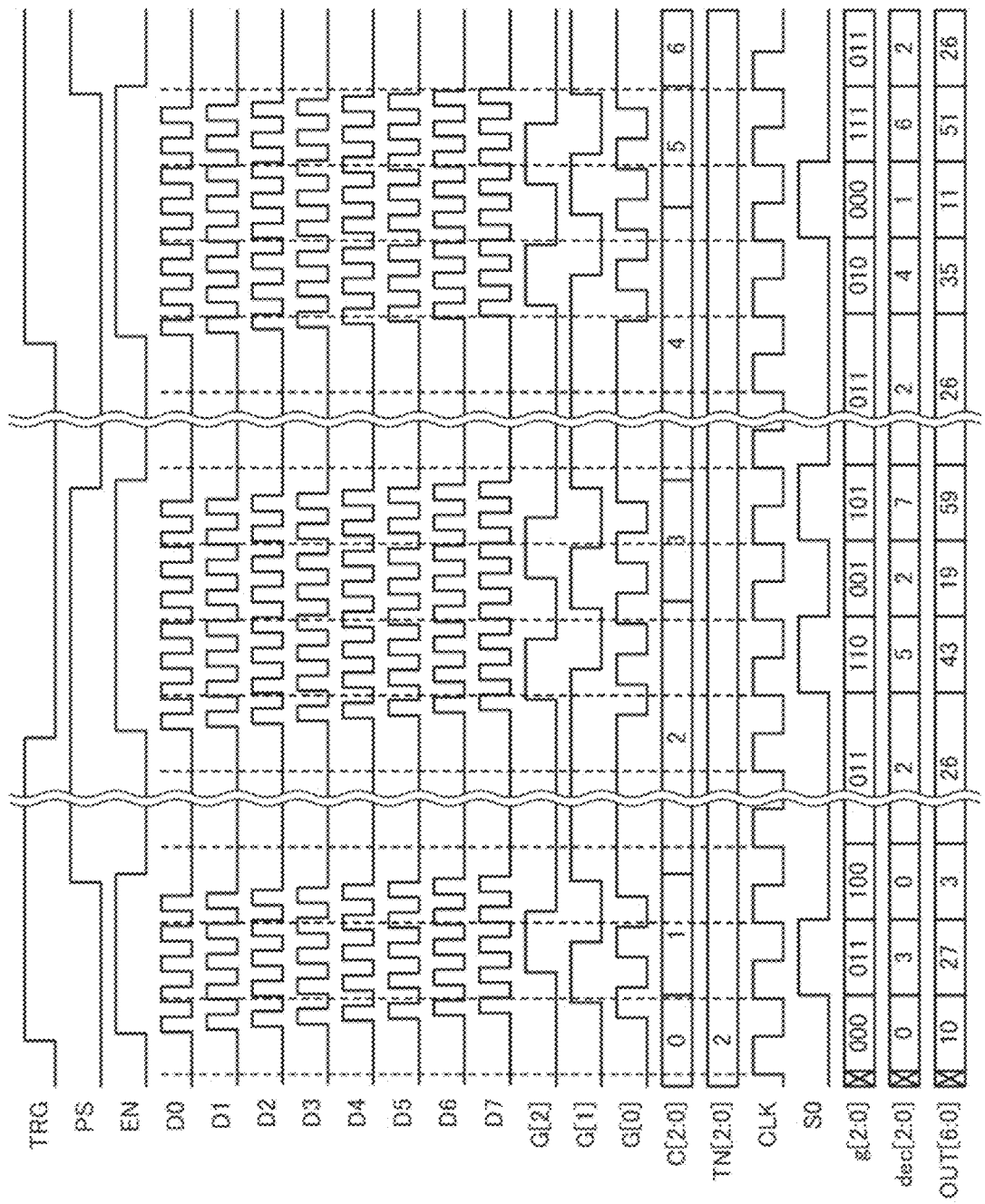
FIG. 19 is a timing chart showing an example of the operation of the transition-state output device.

FIG. 19 is a timing chart showing an example of the operation of the transition-state output device 1 when the truth tables shown in FIGS. 17 and 18 hold. In the example shown in FIG. 19, the cycle of the reference signal CLK is 2.5 times the cycle of the oscillating signal D0. Since the internal state transitions 16 times during one cycle of the oscillating signal D0, the internal state transitions 40 times during one cycle of the reference signal CLK. Therefore, the value of the state signal OUT[6:0] changes by 40 each at the timing of a rising edge of the reference signal CLK during the period when the enable signal EN is high-level.

Incidentally, the ring oscillator circuit 10 and the tapped delay line 200 have temperature characteristics. Depending on the temperature, the cycle of the oscillating signal D0 and the delay times of the delay elements 201-1 to 201-$q$ change. Therefore, when the operation of the time-to-digital converter 100 is secured in a broad temperature range, the condition that the logic level of the oscillating signal D0 changes again during the period until the logic level of the signal D6 changes after the logic level of the signal D5 changes due to a change in the logic level of the oscillating signal D0 is not satisfied, depending on the temperature, and therefore the truth tables shown in FIGS. 17 and 18 do not hold.

For example, if, at a certain temperature, the cycle of the oscillating signal D0 and the delay times of the delay elements 201-1 to 201-7 become shorter, and in an internal state where the signals D0 to D5 are low-level and the signals D6 and D7 are high-level, the signal D6 changes to low-level before the signal D0 changes to high-level, then the internal state transitions to an internal state where the signals D0 to D6 are low-level and the signal D7 is high-level. This internal state after the transition is not included in the truth tables shown in FIGS. 17 and 18. However, no problems occur if the value of the decoded signal dec2[6:0] is a value that is eight times the value of the decoded signal dec[2:0] plus the value of the decoded signal dec0[3:0], which is the sum of the function P0, the function P4, and the function x4, as in the example shown in FIGS. 17 and 18. For example, when a rising edge of the reference signal CLK occurs when in the internal state where the value of the decoded signal dec[2:0] is 0, the signals D0 to D5 are low-level, and the signals D6 and D7 are high-level, the value of the decoded signal dec2[6:0] is 8. When a rising edge of the reference signal CLK occurs when in the next internal state where the value of the decoded signal dec[2:0] is 0, the signals D0 to D6 are low-level, and the signal D7 is high-level, the value of the decoded signal dec2[6:0] is 9. When a rising edge of the reference signal CLK occurs when in the subsequent internal state where the value of the decoded signal dec[2:0] is 0, the signal S0 is high-level, the signals D1 to D6 are low-level, and the signal D7 is high-level, the value of the decoded signal dec2[6:0] is 10. Thus, when the transition-state acquisition section 30 acquires an internal state before or after a transition, the difference in the value of the decoded signal dec2[6:0] is 1 without exception. Therefore, the calculator section 50 can correctly calculate the number of state transitions and no problems occur. Even when the cycle of the oscillating signal D0 and the delay times of the delay elements 201-1 to 201-7 become even shorter, no problems occur.

In this way, no problems occur even when the ring oscillator circuit 10 transitions to the next state due to a temperature change at any timing before the state of the delay element 201-$q$ at the final stage of the tapped delay line 200 transitions. Also, when the ring oscillator circuit 10 transitions to the next state before the state of the delay element 201-$q$ transitions, the frequency of the internal states acquired by the transition-state acquisition section 30 becomes less uneven. Therefore, it is desirable that the ring oscillator circuit 10 transitions to the next state, without exception, before the state of the delay element 201-$q$ at the final stage of the tapped delay line 200 transitions, even when a temperature change occurs.

When the cycle of the oscillating signal D0 and the delay times of the delay elements 201-1 to 201-7 become even shorter, the logic level of the oscillating signal D0 changes again after the logic level of the signal D7 changes due to a change in the logic level of the oscillating signal D0. In other words, the delay time of the tapped delay line 200 is shorter than the half cycle of the oscillating signal D0. In this case, truth tables shown in FIGS. 20 and 21 are defined instead of the truth tables shown in FIGS. 17 and 18. In the example shown in FIGS. 20 and 21, every time the state of the ring oscillator circuit 10 or the state of the tapped delay line 200 changes, the value of the internal state increases by 1 from 3 to 66. The value of the internal state returns to 3 after 66. That is, in the example shown in FIGS. 20 and 21, 64 internal states are defined, and as the internal state transitions by one state, the value of the decoded signal dec2[6:0] increases by 1, as in the example shown in FIGS. 17 and 18. Therefore, no problems occur even if the ring oscillator circuit 10 transitions to the next state after the state of the delay element 201-7 at the final stage of the tapped delay line 200 transitions.

Figure 22:
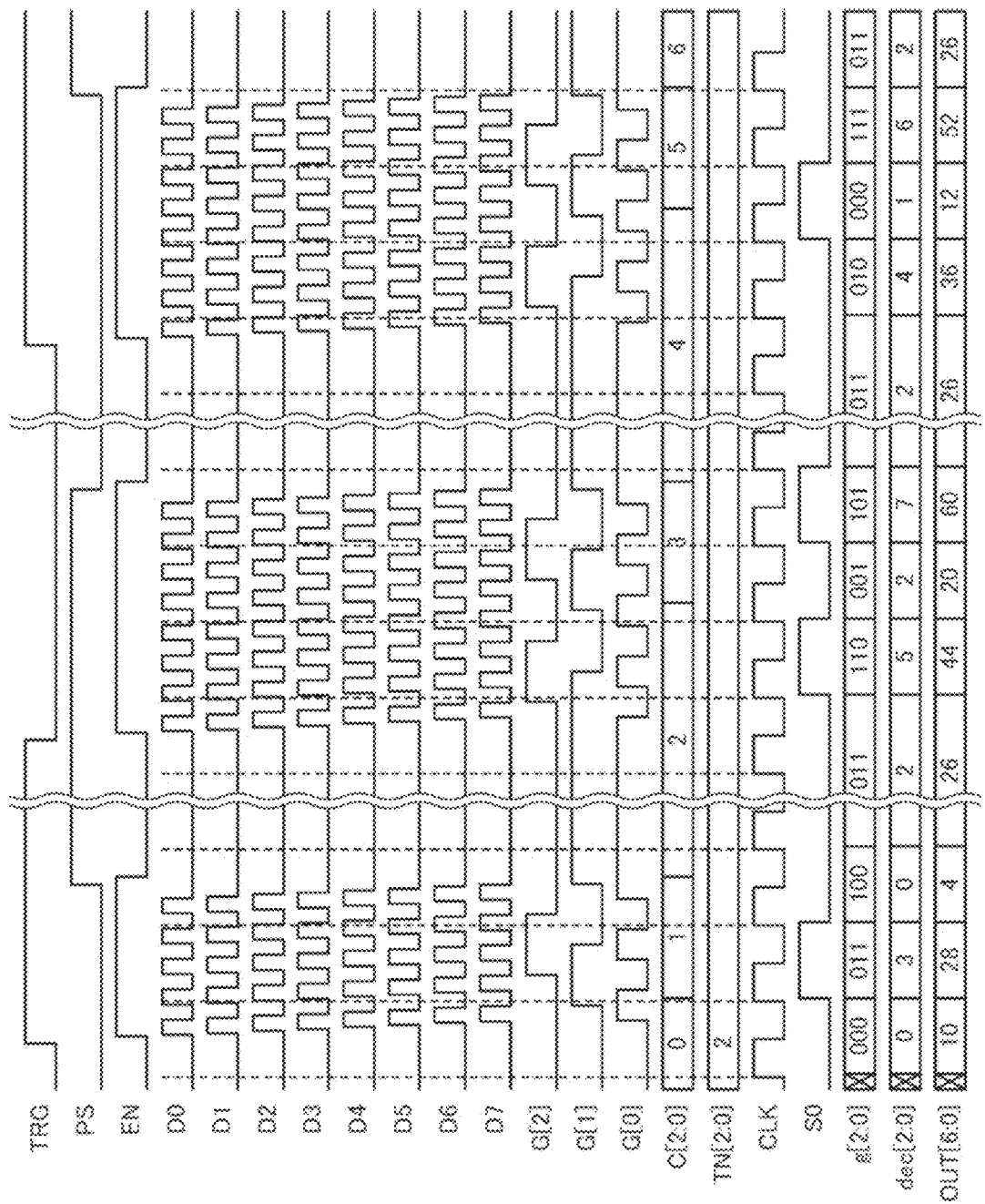
FIG. 22 is a timing chart showing an example of the operation of the transition-state output device.

FIG. 22 is a timing chart showing an example of the operation of the transition-state output device 1 when the truth tables shown in FIGS. 20 and 21 hold. In the example shown in FIG. 22, the cycle of the reference signal CLK is 2.5 times the cycle of the oscillating signal D0. Since the internal state transitions 16 times during one cycle of the oscillating signal D0, the internal state transitions 40 times during one cycle of the reference signal CLK. Therefore, the value of the state signal OUT[6:0] changes by 40 each at the timing of a rising edge of the reference signal CLK during the period when the enable signal EN is high-level.

However, a problem can occur when the cycle of the oscillating signal D0 and the delay times of the delay elements 201-1 to 201-$q$ becomes longer due to a temperature change. If, at a certain temperature, the cycle of oscillating signal D0 and the delay times of the delay elements 201-1 to 201-7 become longer, and in an internal state where the signals D0 to D4 are low-level and the signals D5 to D7 are high-level, the signal D0 changes to high-level before the signal D5 changes to low-level, then the internal state transitions to an internal state where the signals D1 to D4 are low-level and the signals D0 and D5 to D7 are high-level. For example, when the value of the decoded signal dec[2:0] is 0 and a rising edge of the reference signal CLK occurs in the internal state before the transition, the value of the decoded signal dec2[6:0] is 7.

When a rising edge of the reference signal CLK occurs in the internal state after the transition, the value of the decoded signal dec2[6:0] is 8. However, if, at a certain temperature, the cycle of the oscillating signal D0 and the delay times of the delay elements 201-1 to 201-7 become longer, and in an internal state where the signals D0 to D3 are low-level and the signals D4 to D7 are high-level, the signal D0 changes to high-level before the signal D4 changes to low-level, then the internal state transitions to an internal state where the signals D1 to D3 are low-level and the signals D0 and D4 to D7 are high-level. For example, when the value of the decoded signal dec[2:0] is 0 in the internal state before the transition and a rising edge of the reference signal CLK occurs then, the value of the decoded signal dec2[6:0] is 6. When in the internal state after the transition, the value of the decoded signal dec[2:0] is 1. Therefore, when a rising edge of the reference signal CLK occurs, the value of the decoded signal dec2[6:0] is 15. The difference between the values of the decoded signal dec2[6:0] is 9, which causes a problem.

Based on the above consideration, no problems occur if the delay time of the tapped delay line 200 is adjusted in such a way that the truth tables shown in FIGS. 17 and 18 hold when the delay time of the tapped delay line 200 is at its maximum, for example, within a temperature range where the operation of the time-to-digital converter 100 is secured.

The above-described time-to-digital converter 100 according to the second embodiment achieves effects similar to those of the time-to-digital converter 100 according to the first embodiment.

Also, in the time-to-digital converter 100 according to the second embodiment, the number of internal states can be increased according to the number of delay elements included in the tapped delay line 200 in the transition-state output device 1. Therefore, the resolution of the time-digital value TD calculated by the calculator section 50 can be improved.

Also, in the time-to-digital converter 100 according to the second embodiment, the tapped delay line 200 in the transition-state output device 1 is not included in the oscillation loop of the ring oscillator circuit 10 and changes in state according to a change in state of the ring oscillator circuit 10. Therefore, if the delay times of the plurality of delay elements 201-1 to 201-$q$ are made substantially constant, the duration of each state of the tapped delay line 200 is substantially constant. Therefore, in the time-to-digital converter 100 according to the second embodiment, the difference in the duration among the internal states acquired based on the state information including the signal output from the ring oscillator circuit 10, the signal output from the state machine 20, and the signal output from the tapped delay line 200 can be reduced in the transition-state output device 1.

Also, in the time-to-digital converter 100 according to the second embodiment, if the time until the ring oscillator circuit 10 transitions to the next state after a state transition in the delay element 201-$q$ at the final stage of the tapped delay line 200 is equal to or less than the average value of the delay times of the plurality of delay elements 201-1 to 201-$q$ included in the tapped delay line 200 in the transition-state output device 1, the duration of the internal state immediately before the change in the state of the ring oscillator circuit 10 is not longer than the duration of the other internal states and therefore the difference in the duration among the internal states can be reduced further.

Also, in the time-to-digital converter 100 according to the second embodiment, if the ring oscillator circuit 10 transitions to the next state before the state of the delay element 201-$q$ at the final stage of the tapped delay line 200 transitions in the transition-state output device 1 and the calculation by the internal-state calculation section 40 is properly arranged, the internal state can be correctly calculated even when the cycle of change in state of the ring oscillator circuit 10 or the cycle of change in state of the tapped delay line 200 changes due to a temperature change or the like.

1-3. Third Embodiment

A time-to-digital converter according to a third embodiment will now be described mainly in terms of the difference from the first and second embodiments. Components similar to those in the first or second embodiment are denoted by the same reference signs. Descriptions similar to those in the first or second embodiment are omitted or simplified.

An example of the configuration of a time-to-digital converter 100 according to the third embodiment is similar to the configuration shown in FIG. 1 and therefore the illustration thereof is omitted. That is, in the time-to-digital converter 100 according to the third embodiment, the configuration of the transition-state output device 1 is similar to that in the first embodiment. However, in the time-to-digital converter 100 according to the third embodiment, unlike in the time-to-digital converter 100 according to the first embodiment, the ring oscillator circuit 10 does not stop after a trigger signal TRG is input, and when the number of transitions in the internal state of the transition-state output device 1 exceeds a threshold TH, a time-digital value TD is calculated on the assumption that the number of transitions is the threshold TH.

Figure 23:
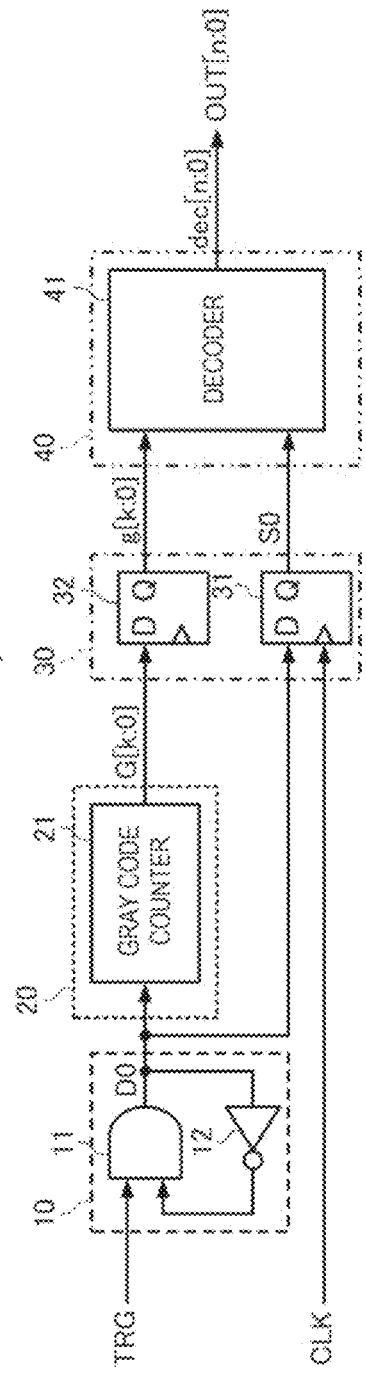
FIG. 23 shows an example of the configuration of a transition-state output device in a third embodiment.

FIG. 23 shows an example of the configuration of the transition-state output device 1 provided in the time-to-digital converter 100 according to the third embodiment. In the example shown in FIG. 23, the transition-state output device 1 has an AND circuit 11, a NOT circuit 12, a Gray code counter 21, a D flip-flop 31, a register 32, and a decoder 41.

The AND circuit 11 outputs an AND signal of the trigger signal TRG and a signal output from the NOT circuit 12. The signal output from the AND circuit 11 is low-level when the trigger signal TRG is low-level. The signal output from the AND circuit 11 is the same logic level as the signal output from the NOT circuit 12 when the trigger signal TRG is high-level.

The NOT circuit 12 outputs a signal formed by inverting the logic level of the signal output from the AND circuit 11. Therefore, when the trigger signal TRG is high-level, the logic level of the signal output from the AND circuit 11 repeats low-level and high-level alternately. That is, the ring oscillator circuit 10 is formed of the AND circuit 11 and the NOT circuit 12 and outputs the signal output from the AND circuit 11, as an oscillating signal D0.

The functions of the Gray code counter 21, the D flip-flop 31, the register 32, and the decoder 41 are similar to those in the first embodiment and therefore the description thereof is omitted.

Figure 24:
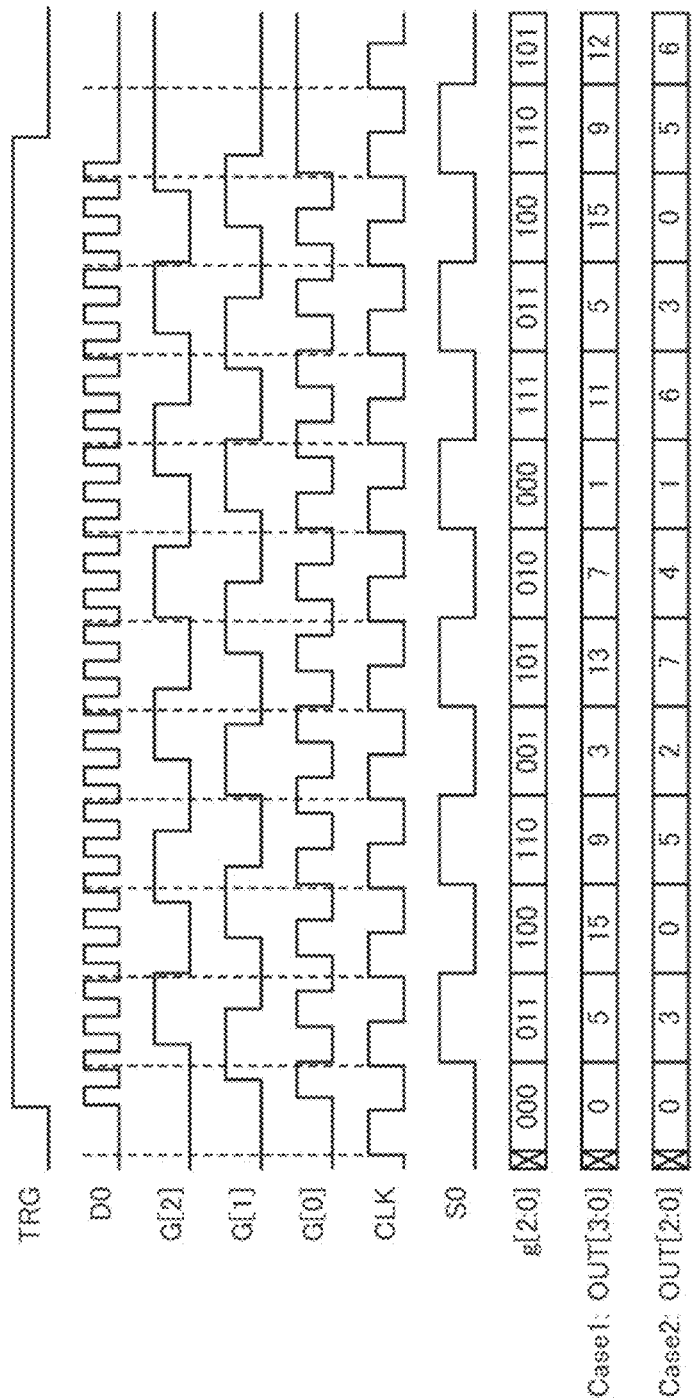
FIG. 24 is a timing chart showing an example of the operation of the transition-state output device.

FIG. 24 is a timing chart showing an example of the operation of the transition-state output device 1. In the example shown in FIG. 24, when the trigger signal TRG changes from low-level to high-level, the enable signal EN transitions from low-level to high-level and the ring oscillator circuit 10 starts to oscillate. Subsequently, during the period when the trigger signal TRG is high-level, the ring oscillator circuit 10 continues oscillating. When the trigger signal TRG changes from high-level to low-level, the ring oscillator circuit 10 stops oscillating.

When the decoder 41 has the truth table shown in FIG. 3, a state signal OUT[3:0] in Case 1 is output. When the decoder 41 has the truth table shown in FIG. 4, a state signal OUT[2:0] in Case 2 is output. In the example shown in FIG. 24, the cycle of the reference signal CLK is 2.5 times the cycle of the oscillating signal D0. In the example shown in FIG. 3, since the internal state transitions four times during one cycle of the oscillating signal D0, the internal state transitions ten times during one cycle of the reference signal CLK. Therefore, during the period when the enable signal EN is high-level, the value of the state signal OUT[3:0] in Case 1 changes by 10 each at the timing of a rising edge of the reference signal CLK. In the example shown in FIG. 4, since the internal state transitions twice during one cycle of the oscillating signal D0, the internal state transitions five times during one cycle of the reference signal CLK. Therefore, during the period when the enable signal EN is high-level, the value of the state signal OUT[2:0] in Case 2 changes by 5 each at the timing of a rising edge of the reference signal CLK.

Figure 25:
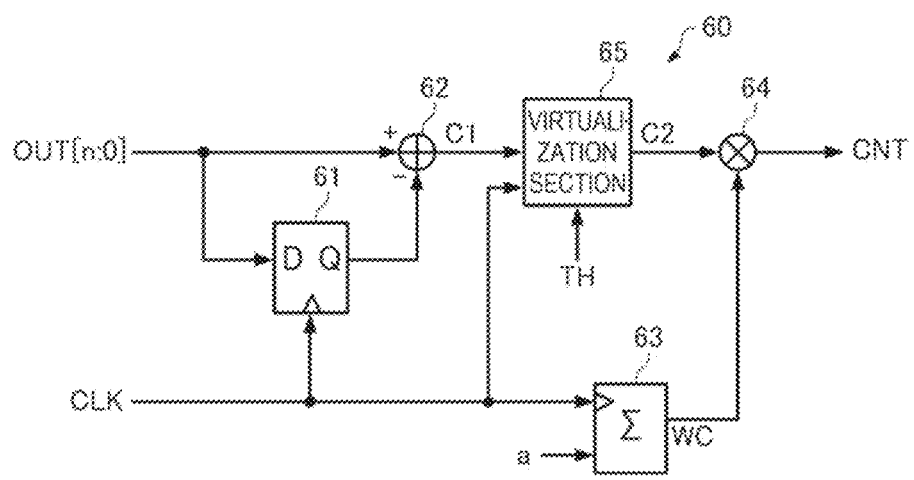
FIG. 25 shows an example of the configuration of a counter section.

FIG. 25 shows an example of the configuration of the counter section 60 provided in the calculator section 50 in the time-to-digital converter 100 according to the third embodiment. The counter section 60 has a register 61, a subtractor 62, an accumulator 63, a multiplier 64, and a virtualization section 65.

The functions of the register 61, the subtractor 62, and the accumulator 63 are similar to those in the first embodiment and therefore the description thereof is omitted.

The signal C1 output from the subtractor 62 is input to the virtualization section 65. As described above, the value of the signal C1 output from the subtractor 62 is equivalent to the number of times the internal state of the transition-state output device 1 has transitioned during the time of the most recent one cycle of the reference signal CLK. The virtualization section 65 accumulates the value of the signal C1 synchronously with the reference signal CLK and thus calculates the number of times the internal state of the transition-state output device 1 has transitioned since the occurrence of a rising edge or a falling edge of the trigger signal TRG. When the calculated number of transitions does not exceed the threshold TH, the virtualization section 65 virtualizes the state signal OUT directly as a signal OUT' and outputs a signal C2 equivalent to the difference of the signal OUT'. In this case, the values of the signal C1 and the signal C2 are equal.

When the calculated number of transitions exceeds the threshold TH, the virtualization section 65 virtualizes the state signal OUT replaced with the threshold TH, as a signal OUT', and outputs a signal C2 equivalent to the difference of the signal OUT'.

The multiplier 64 multiplies the value of the signal C2 output from the virtualization section 65 by the value of the weight coefficient signal WC output from the accumulator 63 and thus calculates the count value CNT. The count value CNT is output from the counter section 60.

Although neither illustrated in FIG. 25 nor described with reference to FIG. 25, a reset signal to initialize the held value to 0 may be input to the register 61 and the accumulator 63 when the state transition in the transition-state output device 1 has stopped or the like.

FIG. 26 shows the relationship between the phase difference PD between the time event of the reference signal CLK and the time event of the trigger signal TRG, and the time-digital value TD. FIG. 26 also shows the value of the state signal OUT, the value of C1, the value of OUT', the value of C2, the value of the weight coefficient signal WC, the count value CNT, and the count value DCNT. In the example shown in FIG. 26, the threshold TH is 64. The constant value a is 1. T is the time of one cycle of the reference signal CLK.

As shown in FIG. 26, every time a time event of the reference signal CLK occurs, the signal OUT' and the signal C2 are generated based on the state signal OUT and the signal C1. Also, the count value CNT is generated based on the signal C2 and the weight coefficient signal WC. The count value DCNT resulting from holding the count value CNT is accumulated to increases the time-digital value TD. When the time event of the reference signal CLK is the $0^{th}$ rising edge and the phase difference PD is T×1.5, the value of the state signal OUT representing the number of transitions in the internal state of the transition-state output device 1 since the occurrence of the time event of the trigger signal TRG exceeds the threshold TH of 64 from the $10^{th}$ rising edge onward. Therefore, from the $10^{th}$ rising edge of the reference signal CLK onward, the signal OUT' is 64. From the $11^{th}$ rising edge of the reference signal CLK onward, the signal C2 is 0. From the $12^{th}$ rising edge of the reference signal CLK onward, the time-digital value TD is 377.

When the phase difference PD is T×1.7, the value of the state signal OUT exceeds the threshold TH of 64 from the $10^{th}$ rising edge of the reference signal CLK onward and therefore the signal OUT' is 64. From the $11^{th}$ rising edge of the reference signal CLK onward, the signal C2 is 0. From the $12^{th}$ rising edge of the reference signal CLK onward, the time-digital value TD is 391.

When the phase difference PD is T×2.7, the value of the state signal OUT exceeds the threshold TH of 64 from the $11^{th}$ rising edge of the reference signal CLK onward and therefore the signal OUT' is 64. From the $12^{th}$ rising edge of the reference signal CLK onward, the signal C2 is 0. From the $13^{th}$ rising edge of the reference signal CLK onward, the time-digital value TD is 455.

When the phase difference PD is T×3.7, the value of the state signal OUT exceeds the threshold TH of 64 from the $12^{th}$ rising edge of the reference signal CLK onward and therefore the signal OUT' is 64. From the $13^{th}$ rising edge of the reference signal CLK onward, the signal C2 is 0. From the $14^{th}$ rising edge of the reference signal CLK onward, the time-digital value TD is 519.

A comparison between FIG. 26 and FIG. 9 shows that the time-digital value TD in FIG. 26 is the same as in FIG. 9 for all the cases where the phase difference PD is T×1.5, T×1.7, T×2.7, and T×3.7. Therefore, in the time-to-digital converter 100 according to the third embodiment, too, the difference value ΔTD between the time-digital values TD is +14, +64, and +64, respectively, as shown in FIG. 10. When the phase difference PD increases by the time T of one cycle of the reference signal CLK, the time-digital value TD increases by the threshold of 64.

The above-described time-to-digital converter 100 according to the third embodiment achieves effects similar to those of the time-to-digital converter 100 according to the first embodiment.

Also, in the time-to-digital converter 100 according to the third embodiment, when the number of transitions in the internal state of the transition-state output device 1 exceeds the threshold TH, the calculator section 50 calculates the time-digital value TD on the assumption that the number of transitions is the threshold TH. Therefore, the number of bits of the time-digital value TD can be reduced. Also, since the transition-state output device 1 needs no circuit for stopping the ring oscillator circuit 10 from oscillating, the size of the transition-state output device 1 can be reduced.

1-4. Fourth Embodiment

A time-to-digital converter according to a fourth embodiment will now be described mainly in terms of the difference from all of the first to third embodiments. Components similar to those in one of the first to third embodiments are denoted by the same reference signs. Descriptions similar to those in one of the first to third embodiments are omitted or simplified.

An example of the configuration of a time-to-digital converter 100 according to the fourth embodiment is similar to the configuration shown in FIG. 11 and therefore the illustration thereof is omitted. However, in the time-to-digital converter 100 according to the fourth embodiment, unlike in the time-to-digital converter 100 according to the second embodiment, the ring oscillator circuit 10 does not stop after a trigger signal TRG is input, and when the number of transitions in the internal state of the transition-state output device 1 exceeds a threshold TH, a time-digital value TD is calculated on the assumption that the number of transitions is the threshold TH.

That is, in the time-to-digital converter 100 according to the fourth embodiment, the configuration of the transition-state output device 1 is similar to that in the second embodiment and the calculator section 50 is similar to that in the third embodiment.

Figure 27:
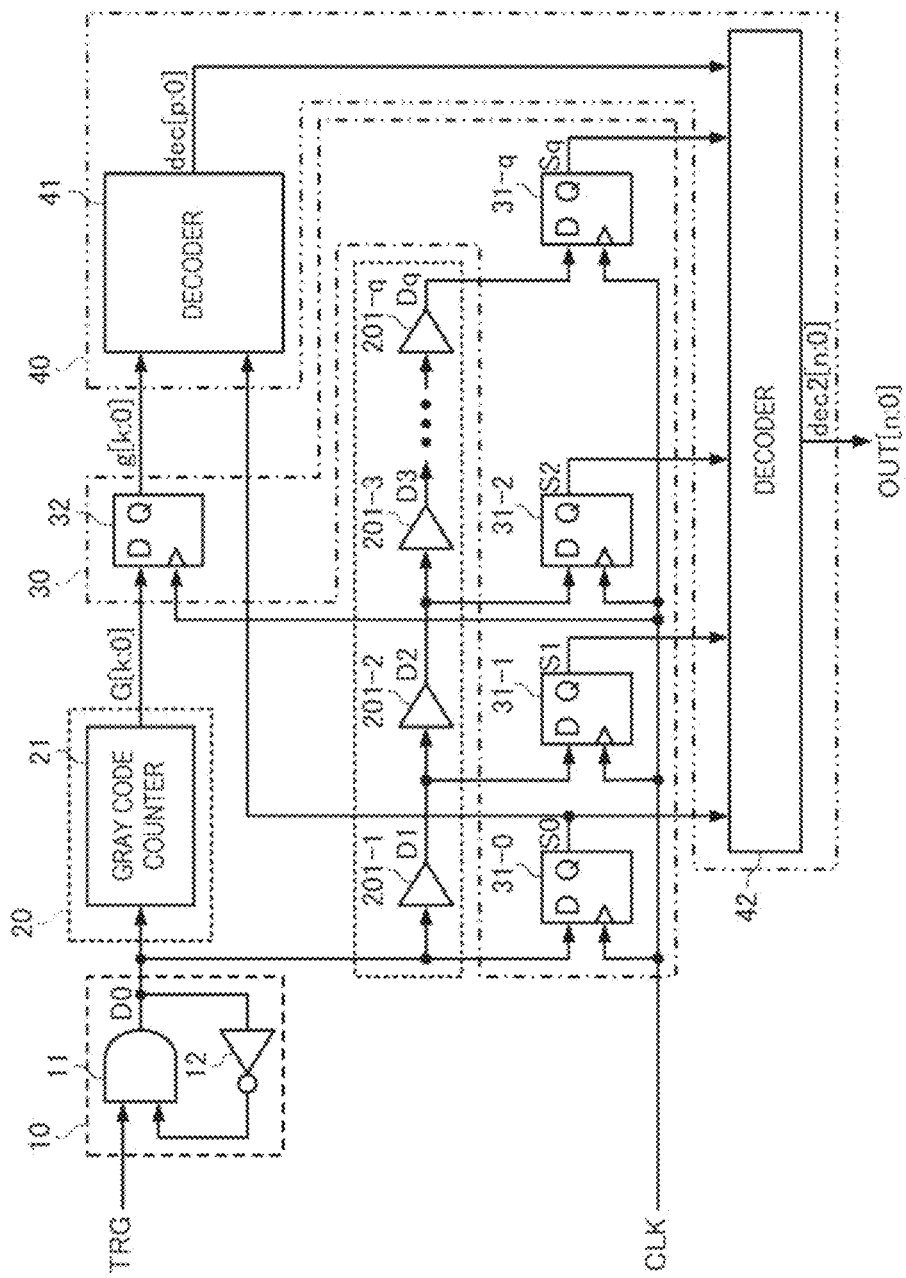
FIG. 27 shows an example of the configuration of a transition-state output device in a fourth embodiment.

FIG. 27 shows an example of the configuration of the transition-state output device 1 provided in the time-to-digital converter 100 according to the fourth embodiment. In the example shown in FIG. 27, the transition-state output device 1 has an AND circuit 11, a NOT circuit 12, a Gray code counter 21, q+1 D flip-flops 31-0 to 31-$q$, a register 32, a decoder 41, a decoder 42, and q delay elements 201-1 to 201-$q$. Here, q is an integer equal to or greater than 2.

The AND circuit 11 outputs an AND signal of the trigger signal TRG and a signal output from the NOT circuit 12. The signal output from the AND circuit 11 is low-level when the trigger signal TRG is low-level. The signal output from the AND circuit 11 is the same logic level as the signal output from the NOT circuit 12 when the trigger signal TRG is high-level.

The NOT circuit 12 outputs a signal formed by inverting the logic level of the signal output from the AND circuit 11. Therefore, when the trigger signal TRG is high-level, the logic level of the signal output from the AND circuit 11 repeats low-level and high-level alternately. That is, the ring oscillator circuit 10 is formed of the AND circuit 11 and the NOT circuit 12 and outputs the signal output from the AND circuit 11, as an oscillating signal D0.

The functions of the Gray code counter 21 are similar to those in the first and second embodiments and therefore the description thereof is omitted. The functions of the D flip-flops 31-0 to 31-$q$, the register 32, the decoder 41, the decoder 42, and the delay element 201-1 to 201-$q$ are similar to those in the second embodiment and therefore the description thereof is omitted. The functions of the calculator section 50 are similar to those in the third embodiment and therefore the description thereof is omitted.

Figure 28:
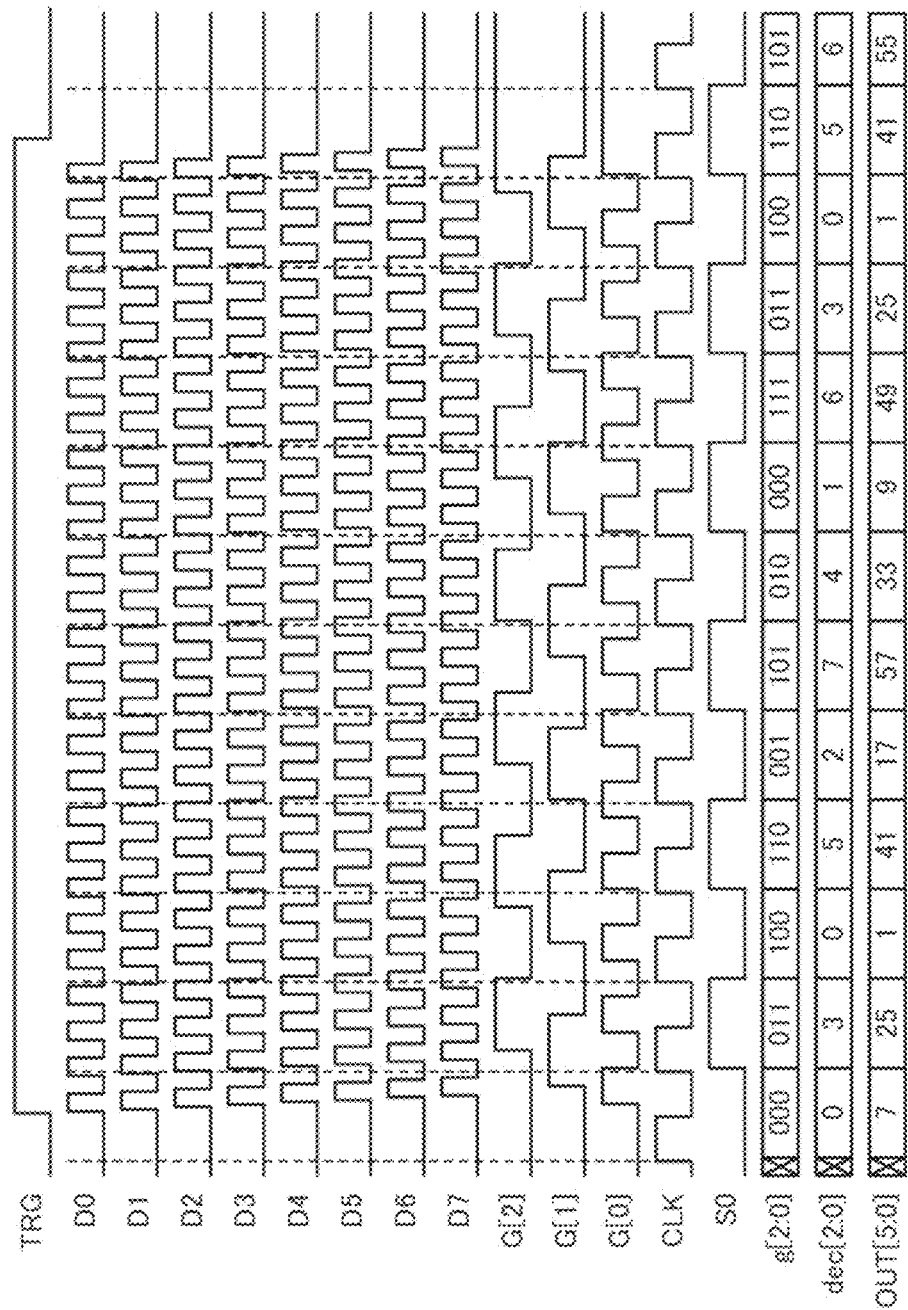
FIG. 28 is a timing chart showing an example of the operation of the transition-state output device.

FIG. 28 is a timing chart showing an example of the operation of the transition-state output device 1. In the example shown in FIG. 28, when the trigger signal TRG changes from low-level to high-level, the enable signal EN transitions from low-level to high-level and the ring oscillator circuit 10 starts to oscillate. Subsequently, during the period when the trigger signal TRG is high-level, the ring oscillator circuit 10 continues oscillating. When the trigger signal TRG changes from high-level to low-level, the ring oscillator circuit 10 stops oscillating.

In the example shown in FIG. 28, the cycle of the reference signal CLK is 2.5 times the cycle of the oscillating signal D0. Since the internal state transitions 16 times during one cycle of the oscillating signal D0, the internal state transitions 40 times during one cycle of the reference signal CLK. Therefore, in the example shown in FIG. 28, the value of the state signal OUT[5:0] changes by 40 each at the timing of a rising edge of the reference signal CLK during the period when the enable signal EN is high-level.

The above-described time-to-digital converter 100 according to the fourth embodiment achieves effects similar to those of the time-to-digital converter 100 according to the second embodiment.

Also, in the time-to-digital converter 100 according to the fourth embodiment, when the number of transitions in the internal state of the transition-state output device 1 exceeds the threshold TH, the calculator section 50 calculates the time-digital value TD on the assumption that the number of transitions is the threshold TH. Therefore, the number of bits of the time-digital value TD can be reduced. Also, since the transition-state output device 1 needs no circuit for stopping the ring oscillator circuit 10 from oscillating, the size of the transition-state output device 1 can be reduced.

1-5. Fifth Embodiment

A time-to-digital converter according to a fifth embodiment will now be described mainly in terms of the difference from all of the first to fourth embodiments. Components similar to those in one of the first to fourth embodiments are denoted by the same reference signs. Descriptions similar to those in one of the first to fourth embodiments are omitted or simplified.

Figure 29:
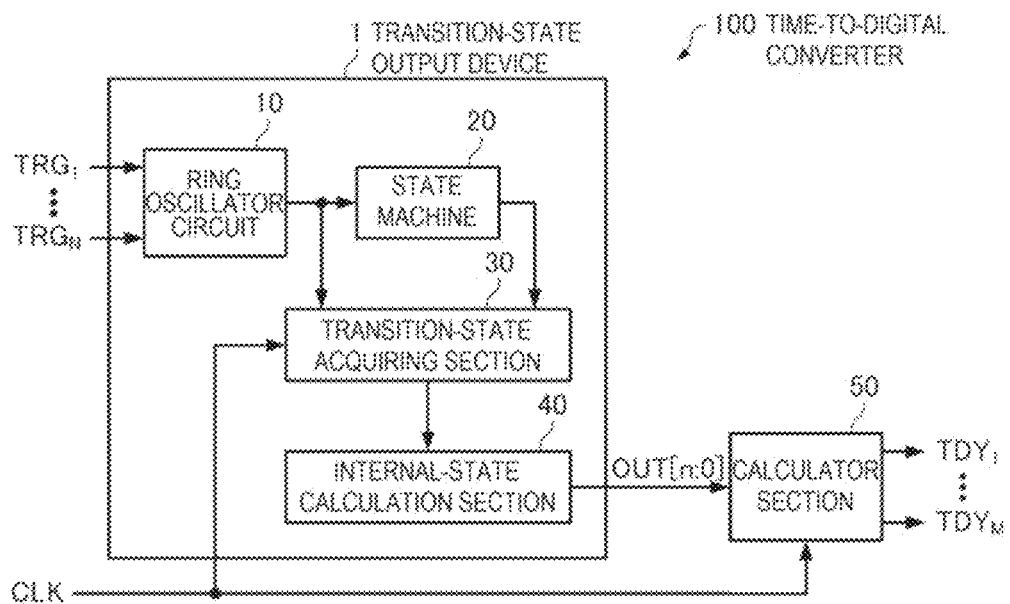
FIG. 29 is a functional block diagram showing a time-to-digital converter according to a fifth embodiment.
Figure 30:
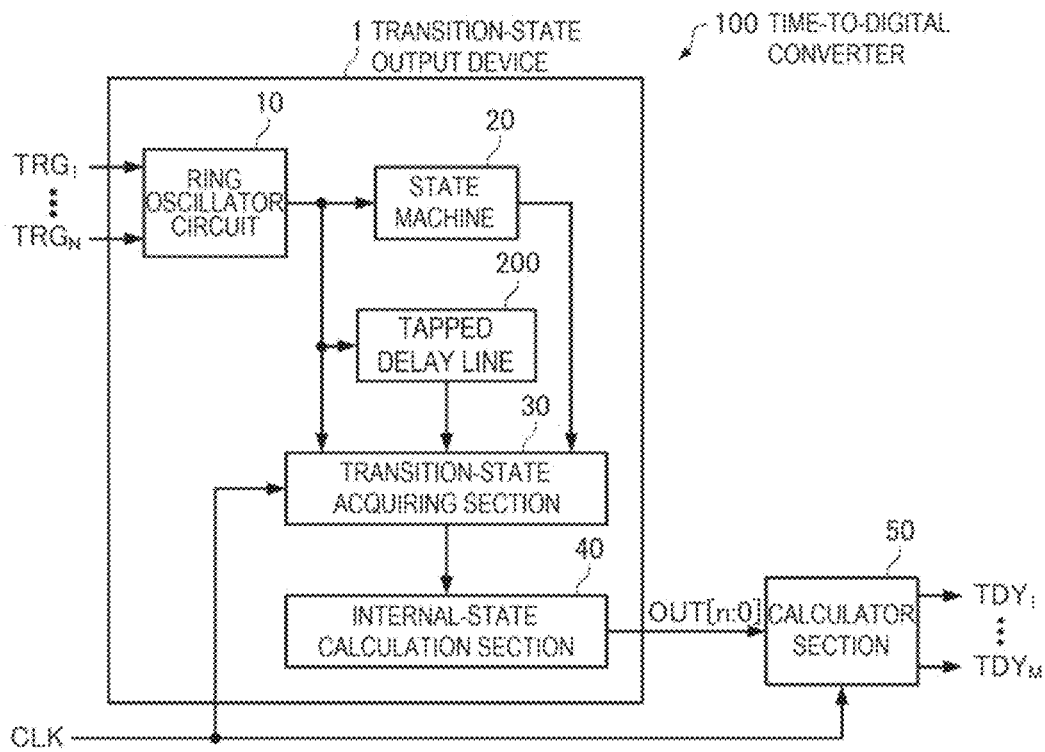
FIG. 30 is another functional block diagram showing the time-to-digital converter according to the fifth embodiment.

FIG. 29 is a functional block diagram showing a time-to-digital converter 100 according to the fifth embodiment. FIG. 30 is another functional block diagram showing the time-to-digital converter 100 according to the fifth embodiment. As shown in FIGS. 29 and 30, the time-to-digital converter 100 according to the fifth embodiment has a transition-state output device 1 and a calculator section 50. The transition-state output device 1 in FIG. 29 is similar to the transition-state output device 1 in the first or third embodiment. The transition-state output device 1 in FIG. 30 is similar to the transition-state output device 1 in the second or fourth embodiment.

N trigger signals $TRG_1$ to $TRG_N$ and a reference signal CLK are input to the time-to-digital converter 100. N is an integer equal to or greater than 2. Time events of the trigger signals $TRG_1$ to $TRG_N$ occur in this order at a predetermined time interval or longer.

The transition-state output device 1 starts to transition in state, based on each of the trigger signals $TRG_1$ to $TRG_N$, and outputs a state signal OUT[n:0] synchronously with a time event of the reference signal CLK. Each state signal OUT[n:0] is input to the calculator section 50.

The calculator section 50 calculates a number of transitions in the internal state of the transition-state output device 1, based on each state signal OUT[n:0], and calculates N time-digital values $TD_1$ to $TD_N$ corresponding to the time events of the trigger signals $TRG_1$ to $TRG_N$, based on the number of transitions. The calculator section 50 then calculates M time-digital values $TDY_1$ to $TDY_M$, each of which is the difference between two of the time-digital values $TD_1$ to $TD_N$. M is an integer equal to or greater than 1.

Figure 31:
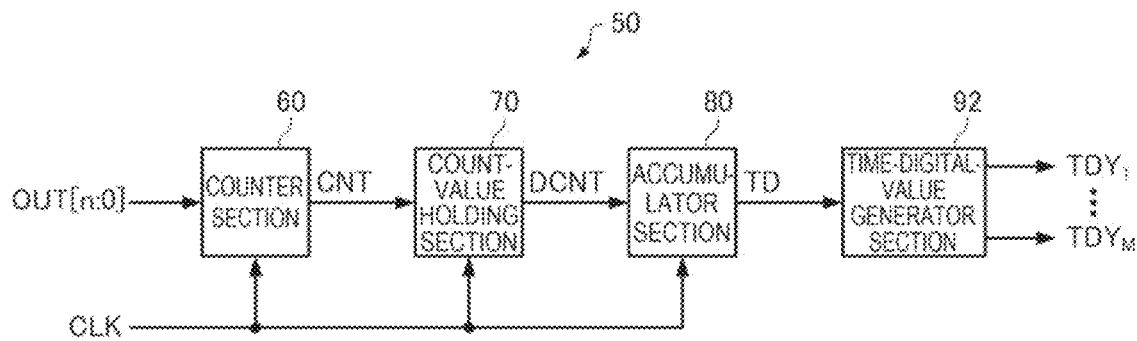
FIG. 31 shows an example of the configuration of a calculator section.

FIG. 31 shows an example of the configuration of the calculator section 50. As shown in FIG. 31, the calculator section 50 has a counter section 60, a count-value holding section 70, an accumulator section 80, and a time-digital-value generator section 92.

The counter section 60 outputs a count value CNT corresponding to a trigger signal TRG, when the time event of the trigger signal $TRG_i$ occurs, i being an integer equal to or greater than 1 and equal to or smaller than N. After the counter section 60 outputs the count value CNT corresponding to the trigger signal $TRG_i$, the count value CNT held by the counter section 60 is initialized to 0. Subsequently, the counter section 60 outputs a count value CNT corresponding to a trigger signal $TRG_{i+1}$ when the time event of the trigger signal $TRG_{i+1}$ occurs.

The count-value holding section 70 successively takes in the count values CNT output from the counter section 60 synchronously with the reference signal CLK and holds the count values CNT as count values DCNT.

The accumulator section 80 successively accumulates the count values DCNT held in order by the count-value holding section 70 synchronously with the reference signal CLK and thus generates the N time-digital values $TD_1$ to $TD_N$ corresponding to the phase difference between the time event of the reference signal CLK and the time event of each of the trigger signals $TRG_1$ to $TRG_N$. The count-value holding section 70 and the accumulator section 80 are initialized, for example, in response to a reset signal or the like, not illustrated, that is input thereto.

The time-digital-value generator section 92 generates the time-digital values $TDY_1$ to $TDY_M$ corresponding to the time interval between the time events of at least two of the trigger signals $TRG_1$ to $TRG_N$, synchronously with the reference signal CLK and based on the N time-digital values $TD_1$ to $TD_N$ corresponding to the trigger signals $TRG_1$ to $TRG_N$.

For example, M=N−1 and the time-digital value $TDY_1$ may be the difference between the time-digital value $TD_{i+1}$ corresponding to the trigger signal $TRG_{i+1}$ and the time-digital value $TD_i$ corresponding to the trigger signal $TRG_i$.

The time-digital-value generator section 92 may also perform predetermined scaling on the time-digital values $TDY_1$ to $TDY_M$ and output the scaled time-digital values $TDY_1$ to $TDY_M$, or may convert time-digital values $TDY_1$ to $TDY_M$, based on a predetermined conversion formula or table information, and output the converted time-digital values $TDY_1$ to $TDY_M$.

A trigger signal $TRG_j$, which is one of the trigger signals $TRG_1$ to $TRG_N$, is an example of a "first trigger signal". A trigger signal $TRG_k$, which is another one of the trigger signals $TRG_1$ to $TRG_N$, is an example of a "second trigger signal". The state signal OUT[n:0] output from the transition-state output device 1 in response to the trigger signal $TRG_j$ is an example of "first state information". The state signal OUT[n:0] output from the transition-state output device 1 in response to the trigger signal $TRG_k$ is an example of "second state information". A time-digital value $TD_j$ output from the accumulator section 80 in response to the trigger signal $TRG_j$ is an example of a "first time-digital value". A time-digital value $TD_k$ output from the accumulator section 80 in response to the trigger signal $TRG_k$ is an example of a "second time-digital value".

In this embodiment, the time event of the reference signal CLK is set separately from the time events of the trigger signals $TRG_1$ to $TRG_N$. That is, the time event of the reference signal CLK and the time events of the trigger signals $TRG_1$ to $TRG_N$ are asynchronous. Each of the time-digital values $TDY_1$ to $TDY_M$ corresponds to the phase difference between the time events of two of the trigger signals $TRG_1$ to $TRG_N$. For example, the time-digital values $TDY_1$ to $TDY_M$ are used as time stamps to the time interval between the time events of two of trigger signals $TRG_1$ to $TRG_N$.

The above-described time-to-digital converter 100 according to the fifth embodiment achieves effects similar to those of the time-to-digital converters 100 according to the first to fourth embodiments.

Also, in the time-to-digital converter 100 according to the fifth embodiment, the time-digital values $TDY_1$ to $TDY_M$ corresponding to the time interval between at least two of the trigger signals $TRG_1$ to $TRG_N$ can be calculated. Also, the time-digital values $TDY_1$ to $TDY_M$ are generated, using the counter section 60, the count-value holding section 70, and the accumulator section 80 in common for the trigger signals $TRG_1$ to $TRG_N$. Therefore, the calculator section 50 can be miniaturized.

2. Analog-to-Digital Converter Circuit 2-1. First Embodiment

Figure 32:
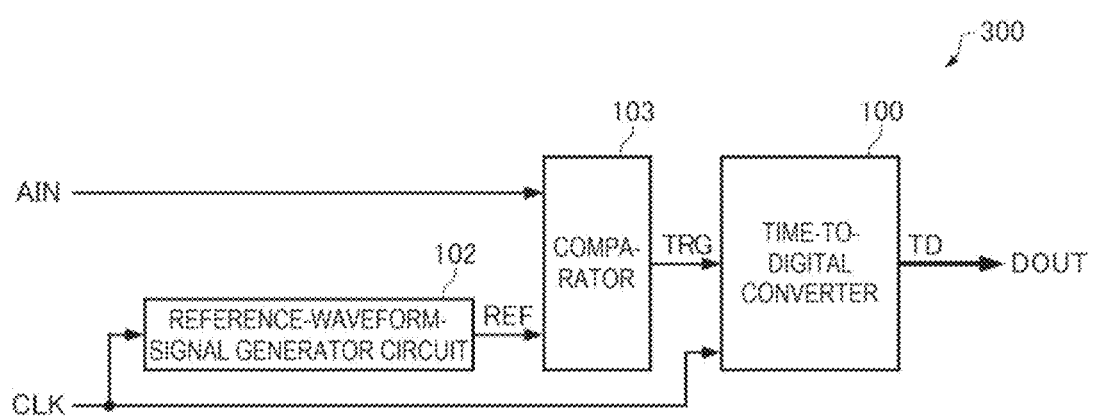
FIG. 32 shows the configuration of an analog-to-digital converter circuit according to the first embodiment.

FIG. 32 shows the configuration of an analog-to-digital converter circuit 300 according to the first embodiment. As shown in FIG. 32, the analog-to-digital converter circuit 300 according to the first embodiment includes a reference-waveform-signal generator circuit 102, a comparator 103, and the time-to-digital converter 100. The analog-to-digital converter circuit 300 converts an analog signal AIN input thereto to a digital signal DOUT and outputs the digital signal DOUT.

The reference-waveform-signal generator circuit 102 generates a reference waveform signal REF based on a reference signal CLK. The reference waveform signal REF is a signal that changes in voltage on the same cycle as the reference signal CLK. The reference waveform signal REF may be, for example, a triangular wave signal, a ramp wave signal, a sine wave signal, a cosine wave signal, or the like. The reference-waveform-signal generator circuit 102 may generate the reference waveform signal REF based on a signal formed by frequency division of the reference signal CLK. In this case, the reference waveform signal REF may be a signal that changes in voltage on the cycle of frequency division of the reference signal CLK. Generating the reference waveform signal REF based on a signal formed by frequency division of the reference signal CLK and restraining the fluctuation in the timing of generation improves the clocking accuracy of the time-to-digital converter 100 and therefore increases the accuracy and resolution of analog-to-digital conversion.

The comparator 103 compares the voltage of the analog signal AIN with the voltage of the reference waveform signal REF generated by the reference-waveform-signal generator circuit 102 and outputs a trigger signal TRG.

As described above, the time-to-digital converter 100 calculates a time-digital value TD corresponding to the phase difference between the time event of the reference signal CLK and the time event of the trigger signal TRG, that is, the time interval between the time event of the reference signal CLK and the time event of the trigger signal TRG.

The analog-to-digital converter circuit 300 outputs the digital signal DOUT based on the time-digital value TD. For example, the analog-to-digital converter circuit 300 may output the time-digital value TD as the digital signal DOUT or may convert the time-digital value TD into a digital signal DOUT having a value that linearly changes in value in relation to the voltage of the analog signal AIN, and output the resulting digital signal DOUT.

Figure 33:
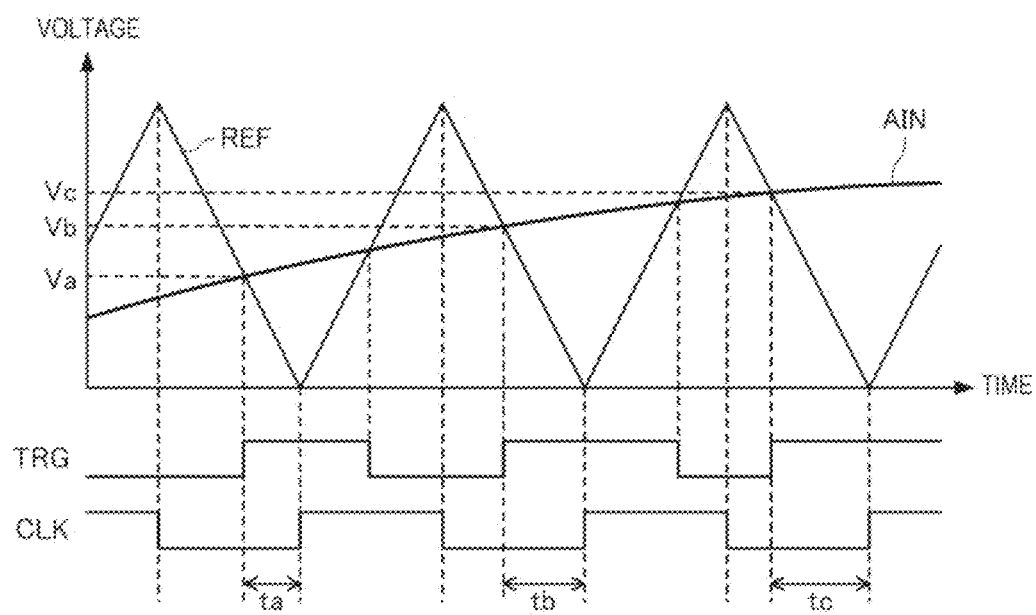
FIG. 33 shows an example of the waveform of various signals.

FIG. 33 shows an example of the waveforms of various signals in the analog-to-digital converter circuit 300 according to the first embodiment. In the example shown in FIG. 33, the reference waveform signal REF is a triangular wave signal having the lowest voltage at a rising edge of the reference signal CLK and having the highest voltage at a falling edge of the reference signal CLK. The trigger signal TRG is high-level when the voltage of the analog signal AIN is higher than the voltage of the reference waveform signal REF. The trigger signal TRG is low-level when the voltage of the analog signal AIN is lower than the voltage of the reference waveform signal REF.

In the example shown in FIG. 33, when the value of the voltage of the analog signal AIN is Va, Vb, and Vc, the time interval between the rising edge of the reference signal CLK and the rising edge of the trigger signal TRG is ta, tb, and tc, respectively. In relation to Va<Vb<Vc, ta<tb<tc holds. The time interval between the rising edge of the reference signal CLK and the rising edge of the trigger signal TRG linearly changes in relation to the voltage of the analog signal AIN. Therefore, the analog-to-digital converter circuit 300 can output the time-digital value TD corresponding to ta, tb, and tc, as the digital signal DOUT.

The analog-to-digital converter circuit 300 according to the first embodiment can achieve high accuracy, high resolution, high-speed processing, lower power consumption, miniaturization, and the like, by using the time-to-digital converter 100.

2-2. Second Embodiment

Figure 34:
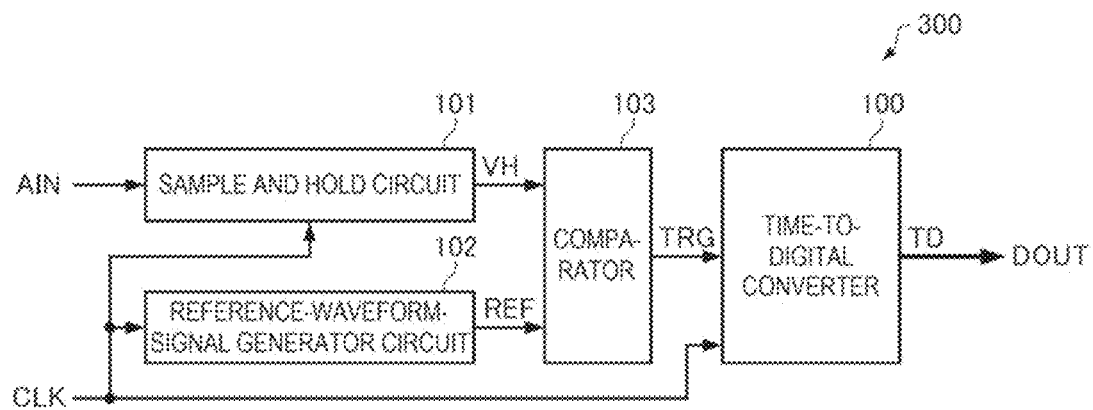
FIG. 34 shows the configuration of an analog-to-digital converter circuit according to the second embodiment.

FIG. 34 shows the configuration of an analog-to-digital converter circuit 300 according to the second embodiment. As shown in FIG. 34, the analog-to-digital converter circuit 300 according to the second embodiment includes a sample and hold circuit 101, a reference-waveform-signal generator circuit 102, a comparator 103, and the time-to-digital converter 100. The analog-to-digital converter circuit 300 converts an analog signal AIN input thereto to a digital signal DOUT and outputs the digital signal DOUT.

The sample and hold circuit 101 samples and holds the voltage of the analog signal AIN synchronously with a reference signal CLK.

The reference-waveform-signal generator circuit 102 generates a reference waveform signal REF based on the reference signal CLK. The reference waveform signal REF is a signal that changes in voltage on the same cycle as the reference signal CLK. The reference waveform signal REF may be, for example, a triangular wave signal, a ramp wave signal, a sine wave signal, a cosine wave signal, or the like. The reference-waveform-signal generator circuit 102 may generate the reference waveform signal REF based on a signal formed by frequency division of the reference signal CLK. In this case, the reference waveform signal REF may be a signal that changes in voltage on the cycle of frequency division of the reference signal CLK. Generating the reference waveform signal REF based on a signal formed by frequency division of the reference signal CLK and restraining the fluctuation in the timing of generation improves the clocking accuracy of the time-to-digital converter 100 and therefore increases the accuracy and resolution of analog-to-digital conversion.

The comparator 103 compares a voltage VH held by the sample and hold circuit 101 with the voltage of the reference waveform signal REF generated by the reference-waveform-signal generator circuit 102 and outputs a trigger signal TRG.

As described above, the time-to-digital converter 100 calculates a time-digital value TD corresponding to the phase difference between the time event of the reference signal CLK and the time event of the trigger signal TRG, that is, the time interval between the time event of the reference signal CLK and the time event of the trigger signal TRG.

The analog-to-digital converter circuit 300 outputs the digital signal DOUT based on the time-digital value TD. For example, the analog-to-digital converter circuit 300 may output the time-digital value TD as the digital signal DOUT or may convert the time-digital value TD into a digital signal DOUT having a value that linearly changes in value in relation to the voltage of the analog signal AIN, and output the resulting digital signal DOUT.

Figure 35:
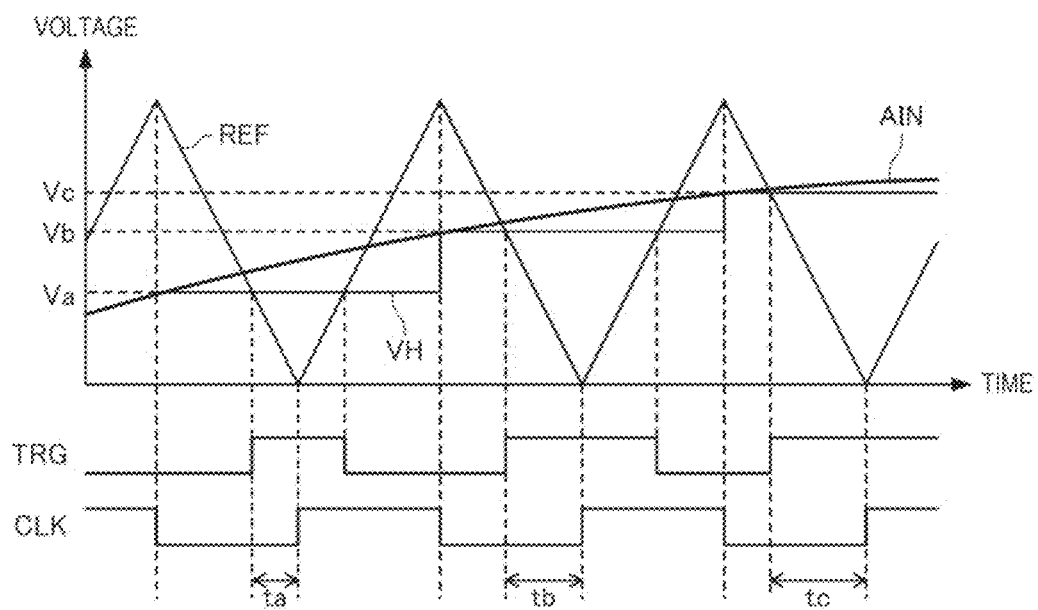
FIG. 35 shows an example of the waveform of various signals.

FIG. 35 shows an example of the waveforms of various signals in the analog-to-digital converter circuit 300 according to the second embodiment. In the example shown in FIG. 35, the voltage of the analog signal AIN is sampled and held at each rising edge of the reference signal CLK. The reference waveform signal REF is a triangular wave signal having the lowest voltage at a rising edge of the reference signal CLK and having the highest voltage at a falling edge of the reference signal CLK. The trigger signal TRG is high-level when the voltage VH is higher than the voltage of the reference waveform signal REF. The trigger signal TRG is low-level when the voltage VH is lower than the voltage of the reference waveform signal REF.

In the example shown in FIG. 35, when the value of the voltage VH, which is the held voltage of the analog signal AIN, is Va, Vb, and Vc, the time interval between the rising edge of the reference signal CLK and the rising edge of the trigger signal TRG is ta, tb, and tc, respectively. In relation to Va<Vb<Vc, ta<tb<tc holds. The time interval between the rising edge of the reference signal CLK and the rising edge of the trigger signal TRG linearly changes in relation to the voltage of the analog signal AIN. Therefore, the analog-to-digital converter circuit 300 can output the time-digital value TD corresponding to ta, tb, and tc, as the digital signal DOUT.

The analog-to-digital converter circuit 300 according to the second embodiment can achieve high accuracy, high resolution, high-speed processing, lower power consumption, miniaturization, and the like, by using the time-to-digital converter 100. Also, in the analog-to-digital converter circuit 300 according to the second embodiment, since the sample and hold circuit 101 can keep the sampling timing constant, the fluctuation in the timing of analog-to-digital conversion can be reduced.

The present disclosure is not limited to the embodiments and can be implemented with various modifications without departing from the spirit and scope of the present disclosure.

The foregoing embodiments and modification examples are simply examples and are not limiting. For example, the embodiments and modification examples can be suitably combined together.

The present disclosure includes a configuration that is substantially the same as a configuration described in the embodiments, for example, a configuration having the same function, method, and result, or a configuration having the same objective and effect. The present disclosure also includes a configuration formed by replacing a non-essential part of a configuration described in the embodiments. The present disclosure also includes a configuration that can achieve the same advantageous effect or the same objective as a configuration described in the embodiments. The present disclosure also includes a configuration formed by adding a known technique to a configuration described in the embodiments.

The following contents are derived from the foregoing embodiments and modification examples.

According to an aspect, a transition-state output device includes: a ring oscillator circuit starting to oscillate based on a trigger signal; a state machine changing in state according to a change in state of the ring oscillator circuit; a transition-state acquisition section acquiring and holding state information including a signal output from the ring oscillator circuit and a signal output from the state machine, synchronously with a reference signal; and an internal-state calculation section calculating an internal state corresponding to a number of changes in state of the ring oscillator circuit, based on the state information held by the transition-state acquisition section. A time until the internal state, after transitioning from a first internal state to a second internal state, transitions to the first internal state again is longer than a time interval of updating the state information held by the transition-state acquisition section.

In this transition-state output device, the ring oscillator circuit has a very simple configuration and therefore has a substantially constant cycle of change in state. The state machine is not included in the oscillation loop of the ring oscillator circuit and changes in state according to the change in state of the ring oscillator circuit. Therefore, the state machine, too, has a substantially constant cycle of change in state. Accordingly, the duration of each state of the ring oscillator circuit and the state machine is substantially constant. Thus, in this transition-state output device, the difference in the duration among the internal states acquired from the state information including the signal output from the ring oscillator circuit and the signal output from the state machine can be reduced.

Also, in the transition-state output device, the time until the internal state, after transitioning from the first internal state to the second internal state, transitions to the first internal state again is longer than the time interval of updating the state information held by the transition-state acquisition section. Therefore, the transition-state acquisition section can acquire the state information before the state transition comes full circle.

In the transition-state output device according to the above aspect, the internal state may change synchronously with a timing when the state of the ring oscillator circuit changes.

In this transition-state output device, the timing when the state of the ring oscillator circuit changes and the timing when the internal state changes are in a relationship of one-to-one correspondence. Since the cycle of change in state of the ring oscillator circuit is substantially constant, the duration of each internal state is substantially constant. Therefore, in this transition-state output device, the difference in the duration among the internal states can be reduced further.

The transition-state output device according to the above aspect may also include a tapped delay line having a plurality of delay elements coupled together. The signal output from the ring oscillator circuit may be input to the tapped delay line. The state information may include a signal output from the tapped delay line.

In this transition-state output device, the number of internal states can be increased according to the number of delay elements included in the tapped delay line.

Also, in this transition-state output device, the tapped delay line is not included in the oscillation loop of the ring oscillator circuit and changes in state according to the change in state of the ring oscillator circuit. Therefore, if the delay times of the plurality of delay elements are made substantially constant, the duration of each state of the tapped delay line is substantially constant. Thus, in this transition-state output device, the difference in the duration among the internal states acquired from the state information including the signal output from the ring oscillator circuit, the signal output from the state machine, and the signal output from the tapped delay line can be reduced.

In the transition-state output device according to the above aspect, a time until the ring oscillator circuit transitions to a next state after a state transition in the delay element at a final stage of the tapped delay line may be equal to or less than an average value of delay times of the plurality of delay elements included in the tapped delay line.

In this transition-state output device, the duration of the internal state immediately before the state of the ring oscillator circuit changes is not longer than the duration of the other internal states. Therefore, the difference in the duration among the internal states can be reduced further.

In the transition-state output device according to the above aspect, the ring oscillator circuit may transition to a next state before the state of the delay element at a final stage of the tapped delay line transitions.

In this transition-state output device, when the calculation by the internal-state calculation section is properly arranged, the internal state can be correctly calculated even when the cycle of change in state of the ring oscillator circuit or the cycle of change in state of the tapped delay line changes due to a temperature change or the like.

According to another aspect, a time-to-digital converter includes: the transition-state output device according to the above aspect; and a calculator section calculating a number of transitions in the internal state and calculating a time-digital value corresponding to a time event of the trigger signal, based on the number of transitions.

This time-to-digital converter includes the transition-state output device that can reduce the difference in the duration among the internal states. Therefore, the calculator section can calculate the time-digital value with high accuracy without performing a calculation to correct the number of transitions in the internal state. Also, since the calculator section need not perform a calculation for correction, the time until the time-digital value is calculated after the trigger signal is input is short and the time and effort to prepare correction information that is necessary for the calculation for correction is saved.

Also, in this time-to-digital converter, the transition-state acquisition section in the transition-state output device can acquire the state information before the state transition comes full circle. Therefore, the calculator section need not identify the number of times the internal state comes full circle during a period from the acquisition of state information by the transition-state acquisition section to the acquisition of the next state information by the transition-state acquisition section. Thus, in this time-to-digital converter, the processing by the calculator section can be simplified.

In the time-to-digital converter according to the above aspect, when the number of transitions in the internal state exceeds a threshold, the calculator section may calculate the time-digital value on the assumption that the number of transitions is the threshold.

In this time-to-digital converter, when the number of transitions in the internal state exceeds the threshold, the time-digital value is calculated on the assumption that the number of transitions is the threshold. Therefore, the number of bits of the time-digital value can be reduced. Also, since a circuit for stopping the ring oscillator circuit from oscillating is not needed, the size of the transition-state output device can be reduced.

In the time-to-digital converter according to the above aspect, the trigger signal may be defined as a first trigger signal. The state information may be defined as first state information. The time-digital value may be defined as a first time-digital value. The ring oscillator circuit may start to oscillate, based on a second trigger signal. The transition-state acquisition section may acquire and hold second state information including the signal output from the ring oscillator circuit and the signal output from the state machine, synchronously with the reference signal after the second trigger signal is input to the ring oscillator circuit. The internal-state calculation section may calculate the internal state corresponding to a number of changes in state of the ring oscillator circuit, based on the second state information held by the transition-state acquisition section. The calculator section may calculate a number of transitions in the internal state and calculate a second time-digital value corresponding to a time event of the second trigger signal, based on the number of transitions, and may calculate a difference between the first time-digital value and the second time-digital value.

In this time-to-digital converter, the time-digital value corresponding to the time interval between the first trigger signal and the second trigger signal can be calculated.

According to still another aspect, an analog-to-digital converter circuit converting an input analog signal to a digital signal and outputting the digital signal is provided. The analog-to-digital converter circuit includes: the time-to-digital converter according to the above aspect; a reference-waveform-signal generator circuit generating a reference waveform signal based on the reference signal; and a comparator comparing a voltage of the analog signal with a voltage of the reference waveform signal and outputting the trigger signal. The analog-to-digital converter circuit outputs the digital signal based on the time-digital value calculated by the time-to-digital converter.

This analog-to-digital converter circuit can achieve high accuracy, high resolution, high-speed processing, lower power consumption, miniaturization, and the like, by using the time-to-digital converter.

According to still another aspect, an analog-to-digital converter circuit converting an input analog signal to a digital signal and outputting the digital signal is provided. The analog-to-digital converter circuit includes: the time-to-digital converter according to the above aspect; a sample and hold circuit sampling and holding a voltage of the analog signal; a reference-waveform-signal generator circuit generating a reference waveform signal based on the reference signal; and a comparator comparing the voltage held by the sample and hold circuit with a voltage of the reference waveform signal and outputting the trigger signal. The analog-to-digital converter circuit outputs the digital signal based on the time-digital value calculated by the time-to-digital converter.

This analog-to-digital converter circuit can achieve high accuracy, high resolution, high-speed processing, lower power consumption, miniaturization, and the like, by using the time-to-digital converter. Also, since the sample and hold circuit can keep a constant sampling timing, the fluctuation in the timing of analog-to-digital conversion can be reduced.

What is claimed is:

1. A time-to-digital converter comprising:
a transition-state output device, the transition-state output device including:
   a ring oscillator circuit that oscillates based on a trigger signal;
   a state machine changing in state according to a change in state of the ring oscillator circuit;
   a transition-state acquisition section acquiring state information including a signal output from the ring oscillator circuit and a signal output from the state machine, synchronously with a reference signal; and
   an internal-state calculation section calculating an internal state corresponding to a number of changes in state of the ring oscillator circuit, based on the state information acquired by the transition-state acquisition section; and
a calculator section calculating a number of transitions in the internal state and calculating a time-digital value corresponding to a time event of the trigger signal, based on the number of transitions,
wherein, when the number of transitions in the internal state exceeds a threshold, the calculator section calculates the time-digital value on the assumption that the number of transitions is the threshold.

2. The time-to-digital converter according to claim 1, wherein
the state machine includes a Gray code counter that outputs a Gray code signal based on a change in state of an oscillating signal output from the ring oscillator.

3. The time-to-digital converter according to claim 2, wherein the transition-state acquisition section further includes:
a first register that acquires the Gray code signal and holds a first signal according to the value of the Gray code signal, synchronously with a reference signal; and
a second register that acquires the Gray code signal and holds a second signal according to the value of the Gray code signal, synchronously with a reference signal.

4. The time-to-digital converter according to claim 3, wherein the internal-state calculation section further includes:
a decoder that decodes a third signal including the first signal and the second signal and outputs a decoded signal.

5. The time-to-digital converter according to claim 4, wherein
the first signal is a signal indicating the state of the ring oscillator at the timing of a rising edge of the reference signal,
the second signal is a signal indicating the state of the state machine at the timing of a rising edge of the reference signal, and
the decoded signal is indicating the internal state at the timing of a rising edge of the reference signal.

6. The time-to-digital converter according to claim 5, further comprising:
a tapped delay line having a plurality of delay elements coupled together, wherein
the state information includes a signal output from the tapped delay line.

7. The time-to-digital converter according to claim 6, wherein
the ring oscillator includes an AND circuit and a NOT circuit, wherein
the AND circuit outputs an AND signal of the trigger signal and a signal output from the NOT circuit, and
the NOT circuit outputs a signal obtained by inverting the logic level of the AND signal.

8. The time-to-digital converter according to claim 7, further comprising:
a counter that counts the number of rising edges of a bit signal of the Gray code signal output from the Gray code counter and outputs a count signal.

9. The time-to-digital converter according to claim 8, further comprising:
a stop control circuit that outputs a stop control signal that is inverted every time an amount of increase in the value of the count signal output from the counter coincides with a value of a stop setting signal.

10. The time-to-digital converter according to claim 9, further comprising:
an exclusive OR circuit that outputs an exclusive OR signal of the trigger signal and the stop control signal output from the stop control circuit.

11. The time-to-digital converter according to claim 1, wherein
a time until the internal state, after transitioning from a first internal state to a second internal state, transitions to the first internal state again is longer than a time interval of updating the state information held by the transition-state acquisition section.

12. An analog-to-digital converter circuit converting an input analog signal to a digital signal and outputting the digital signal, the analog-to-digital converter circuit comprising:
the time-to-digital converter according to claim 1;
a reference-waveform-signal generator circuit generating a reference waveform signal based on the reference signal; and
a comparator comparing a voltage of the analog signal with a voltage of the reference waveform signal and outputting the trigger signal,
the analog-to-digital converter circuit outputting the digital signal based on the time-digital value calculated by the time-to-digital converter.

13. An analog-to-digital converter circuit converting an input analog signal to a digital signal and outputting the digital signal, the analog-to-digital converter circuit comprising:
the time-to-digital converter according to claim 1;
a sample and hold circuit sampling and holding a voltage of the analog signal;
a reference-waveform-signal generator circuit generating a reference waveform signal based on the reference signal; and
a comparator comparing the voltage held by the sample and hold circuit with a voltage of the reference waveform signal and outputting the trigger signal,
the analog-to-digital converter circuit outputting the digital signal based on the time-digital value calculated by the time-to-digital converter.

* * * * *